(12) United States Patent
Arai et al.

(10) Patent No.: US 6,531,677 B2
(45) Date of Patent: Mar. 11, 2003

(54) METHOD AND APPARATUS FOR DRILLING PRINTED WIRING BOARDS

(75) Inventors: Kunio Arai, Ebina (JP); Kazuhisa Ishii, Ebina (JP); Yasuhiko Kita, Ebina (JP)

(73) Assignee: Hitachi Via Mechanics, Ltd., Ebina (JP)

( * ) Notice: Subject to any disclaimer, the term of this patent is extended or adjusted under 35 U.S.C. 154(b) by 0 days.

(21) Appl. No.: 09/970,909

(22) Filed: Oct. 5, 2001

(65) Prior Publication Data

US 2002/0040893 A1 Apr. 11, 2002

(30) Foreign Application Priority Data

Oct. 6, 2000 (JP) ........................................ 2000-308355
May 9, 2001 (JP) ........................................ 2001-138204

(51) Int. Cl.[7] ........................... B23K 26/38; B23K 26/40
(52) U.S. Cl. ............................... 219/121.71; 219/121.61; 219/121.7; 219/121.76
(58) Field of Search ........................ 219/121.7, 121.71, 219/121.61, 121.73, 121.74, 121.75, 121.76

(56) References Cited

U.S. PATENT DOCUMENTS

| | | | | |
|---|---|---|---|---|
| 5,010,232 | A | | 4/1991 | Arai ......................... 219/121.7 |
| 5,593,606 | A | | 1/1997 | Owen ....................... 219/121.71 |
| 5,731,047 | A | * | 3/1998 | Noddin .................... 219/121.71 |
| 5,783,793 | A | * | 7/1998 | Emerton et al. ......... 219/121.71 |
| 5,841,099 | A | * | 11/1998 | Owen et al. ............. 219/121.71 |
| 6,407,363 | B2 | * | 6/2002 | Dunsky et al. .......... 219/121.71 |

FOREIGN PATENT DOCUMENTS

| | | |
|---|---|---|
| JP | 5864097 | 4/1983 |
| JP | 10173318 | 6/1988 |
| JP | 1266983 | 10/1989 |
| JP | 2983481 | 9/1999 |

OTHER PUBLICATIONS

"Excimer Lasers: An emerging technology in the electronics industry" IPC Technical Review, Nov. 1987.
"Generating Small Holes for IBMs new LSI Package Design" IPC Technical Review, Dec. 1982.
"Laser–abrasion to sonoouyoh" Koronasaha, 1999.

* cited by examiner

*Primary Examiner*—Geoffrey S. Evans
(74) *Attorney, Agent, or Firm*—Crowell & Moring LLP

(57) ABSTRACT

An improved method and apparatus for drilling blind via holes to connect between upper conductive layers and lower conductive layers of printed wiring boards with laser lights. The resin layer contacting the targeted conductive layer is drilled to remain the residual layer with laser lights, and the residual layer is removed with a UV laser beam whose energy density is lower than the decomposition energy threshold of the conductive layer and higher than that of the resin layer. The apparatus for this drilling has at least two laser paths. The spatial energy distributions are made top-hat-shaped with beam homogenizer units in the paths, and the diameters and the energy densities are adjusted independently.

10 Claims, 18 Drawing Sheets

CIRCULAR PROCESSING (DRILLING)

PULSE-REPEATED PROCESSING (DRILLING)

PULSE-REPEATED PROCESSING (DRILLING)

CIRCULAR PROCESSING (DRILLING)

PULSE-REPEATED PROCESSING (DRILLING)

PULSE-REPEATED PROCESSING (DRILLING)

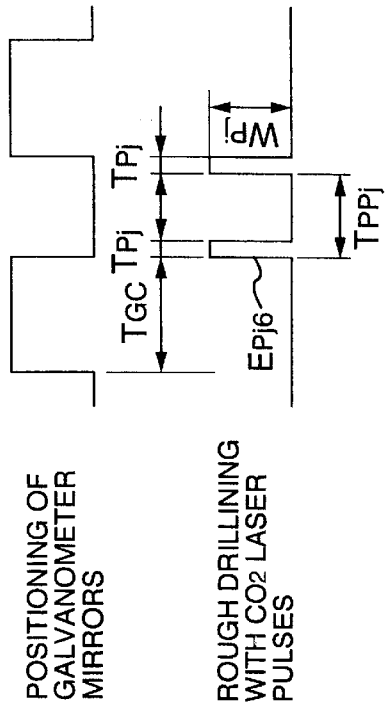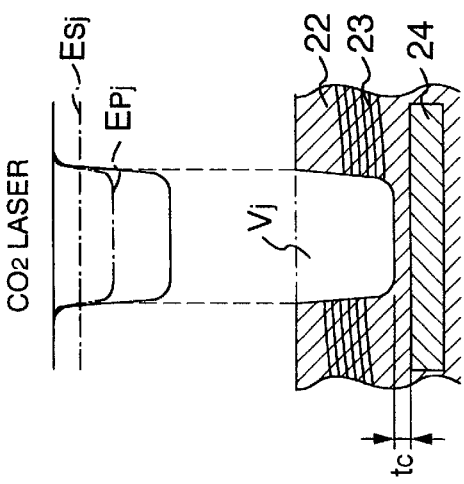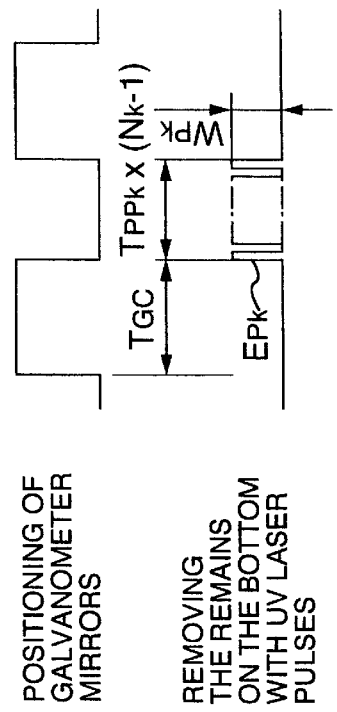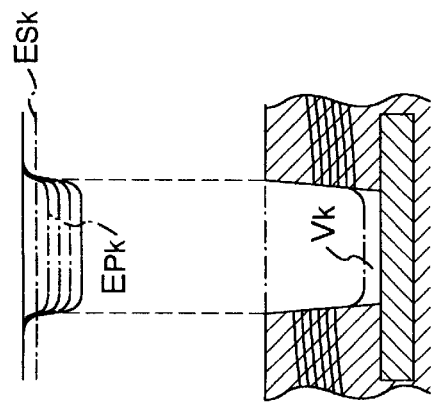

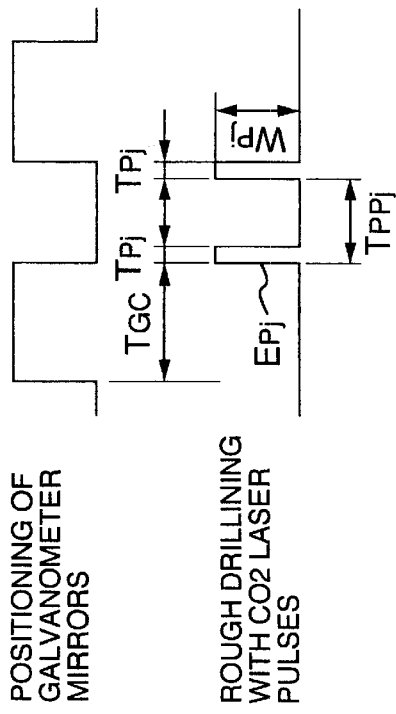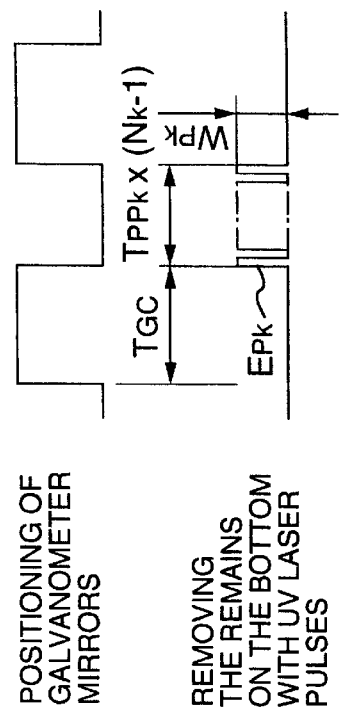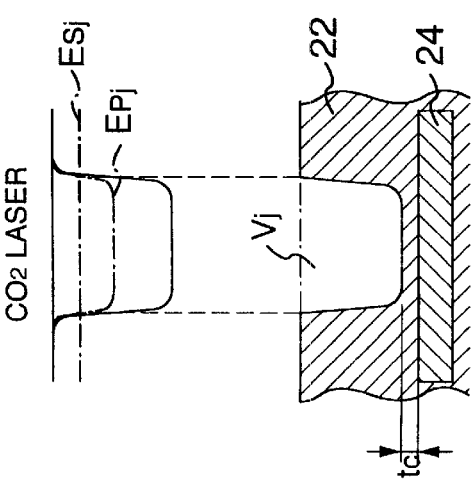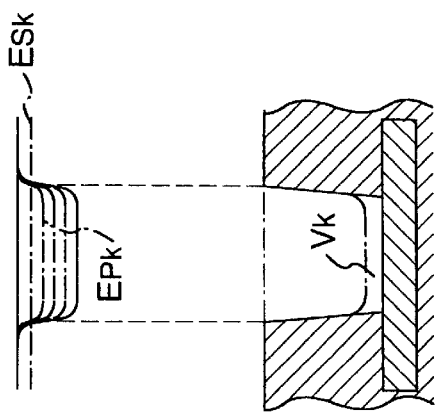

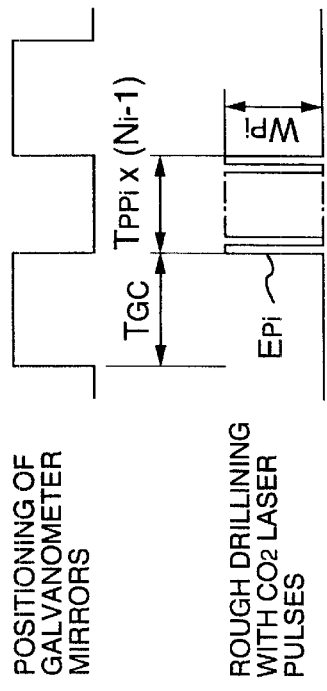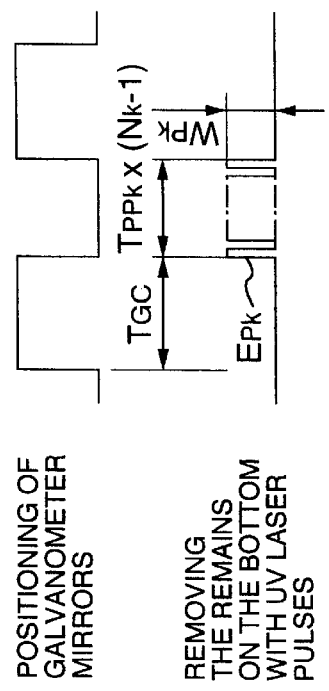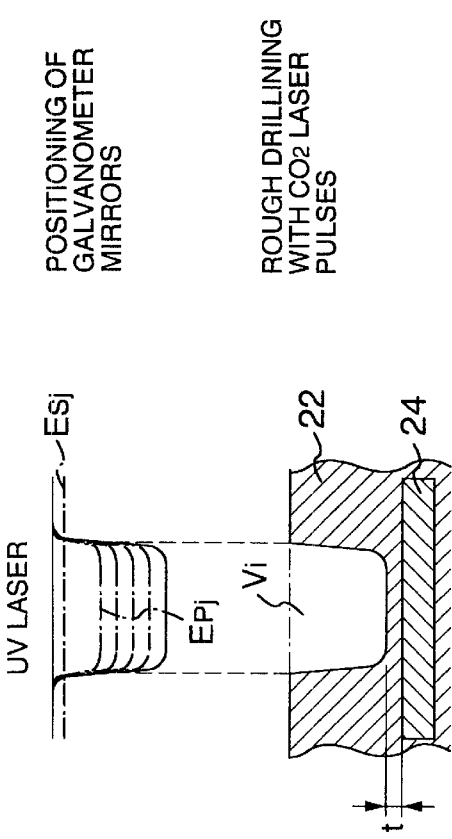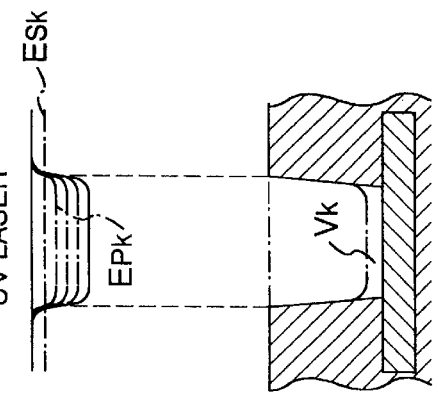

METHOD AND APPARATUS FOR DRILLING PRINTED WIRING BOARDS

TECHNICAL FIELD OF THE INVENTION

The invention relates to an improved method and apparatus for drilling printed wiring boards with laser lights. More particularly, it relates to drilling blind via holes to connect between upper conductive layers and lower conductive layers.

BACKGROUND OF THE INVENTION

FIG. 17 shows a diagram of a conventional optical system for drilling with laser light. In this laser drilling system, a laser beam 2 emitted from a laser head 1 is collimated and magnified or minified with a collimator 3, then shaped into a suitable diameter for drilling with an aperture 4. The shaped laser beam 2 is reflected by a corner mirror 5 and a mirror 14 in a machining head Z, then reflected by a pair of galvanometer mirrors $15_a$, $15_b$ to a f-θ lens 16. The laser beam 2 is positioned with the galvanometer mirrors $15_a$, $15_b$ and incident vertically on a machining surface through the f-θ lens. The machining is conducted on every machining area 18 defined by the size of f-θ lens 16 and the area is moved by a X-Y table (not shown) from $18_1$ to $18_N$ sequentially.

FIG. 18a shows effects of the collimator 3 and aperture 4. The graphs on the lower part of this figure show distributional relationships between laser light energy (ordinate) and radial positions in laser beam (abscissa). Since the spatial energy distribution at the output window of the laser head 1 is a gaussian distribution in general, the spatial energy distribution of the laser beam passed through the collimator 3 is also a gaussian distribution. The size of the laser beam can be varied by magnifications (magnifying ratios or minifying ratios) of the collimator 3. That is, when the magnification is low, the diameter of the laser beam becomes small and the spatial energy distribution shows a high energy (or power) density profile of "a'-distribution (dotted line)" shown in FIG. 18a, and when the magnification is high, the diameter of the laser beam becomes large and the spatial energy distribution shows a low energy (or power) density profile of "b'-distribution (dotted line)" shown in FIG. 18a.

In particular, if the diameter of the aperture 4 is larger, the bottom of a machined via hole (i.e. the surface of an inner conductive layer) may be damaged because the energy is concentrated at the center. Therefore, an "A'-distribution (solid line)" or a "B'-distribution (solid line)" is made to avoid the damages by cutting out a central part of the beam, witch is a relatively homogeneous part of energy distribution, with the appropriate aperture 4. Hereafter, a full spatial energy distribution got by removing the aperture 4 from the optical path is called "C'-distribution".

FIG. 18b, on the other hand, shows a spatial energy distribution when a beam homogenizer 30 is used in the optical path. The spatial energy distribution is shaped like a rectangle with the beam homogenizer 30, minified or magnified by a collimator 3 ("a-distribution (dotted line)" or "b-distribution (dotted line)" in FIG. 18b), then cut out with a aperture 4, made highly homogenized ("A-distribution (solid line)" or "B-distribution (solid line)" in FIG. 18b). Hereafter, these rectangle-like shaped distributions are called "top-hat shaped" distributions and a full spatial energy distribution with the beam homogenizer 30, obtained by removing the aperture 4 from the optical path, is called "C-distribution". Various commercial optical products can be used for the beam homogenizer 30, such as an aspheric lens system or a diffractive optical system.

Typical structures of printed wiring boards are an "glass-containing substrate" (FR-4) which is a substrate laminated alternately with a layer or layers of conductor and a layer or layers of resin containing glass-fibers and whose surface layer is a conductive layer, an "RCC substrate" which is a substrate laminated alternately with a layer or layers of conductor and a layer or layers of resin and whose surface layer is a conductive layer, and a "resin-direct substrate" whose conductive layer is coated with a resin layer. Epoxy or polyimide is mainly used as the resin. Instead of glass-fibers, ceramic materials are sometimes used to reinforce the resin layer.

The following drilling methods with $CO_2$ laser having a wavelength of 10.6 μm are well known. A method of forming a blind via hole in the resin layer of a resin-direct substrate, called "$CO_2$ resin direct method", was disclosed in "GENERATING SMALL HOLES FOR IBMs NEW LSI PACKAGE DESIGN" in IPC Technical Review, Pages 12–15, April 1982 and has been put to practical use. A method of forming a blind via hole in the resin layer of a glass-containing substrate with $CO_2$ laser after forming a window previously by chemical etching or drilling was disclosed in Japanese Publication No. 58-64097 JP A1 and U.S. Pat. No. 5,010,232.

Moreover, a method for drilling through via holes or blind via holes in a substrate laminated alternately with multiple conductive layers and multiple resin layers was disclosed in Japanese Publication No. 01-266983 JP A1. That is a process of forming a window in a conductive layer by circular processing (in another word, "trepanning") with a ultraviolet ("UV") laser light, which can effectively remove metals, and of drilling a resin layer with a $CO_2$ laser light, repeatedly.

However, it is known that a thin residual resin layer (called "smear") having thicknesses ($t_c$) in the range of 0.2~3 μm remains on the bottom of a via hole, in other words, just upon the conductive layer after the $CO_2$ laser drilling. Furthermore, we found that the thickness of $t_c$ cannot be varied even if the energy densities or the numbers of shots of the $CO_2$ laser pulses are variously changed.

The following is our speculation about a cause of the remaining. The $CO_2$ laser drilling is a method utilizing thermal decomposition of resin layer at a temperature increased with the absorption of the infrared laser light. Hence, since the thermal conductivity of the (inner) conductive layer, for example, copper, is 1000 times higher than that of the resin layer, the thermal energy begins to flow into the inner conductive layer when the resin layer becomes thin. Therefore, the temperature of the resin layer cannot go up to the decomposition temperature in a thin residual layer and the residual layer of thickness 0.2~3 μm remains consequently.

When the layer remains, a chemical desmear process is inevitable to remove the residual layer, which comprises steps for conditioning, washing, boiling, cooling, washing, swelling, washing, desmearing by oxidization, washing, neutralizing, washing, drying, etc. In this chemical desmear process, the wettability in the holes is low at diameters of the via holes less than 100 μm, that is, it is difficult for the desmear fluid to enter the via holes deeply, and therefore the reliability of the process decreases. Moreover, there is a problem that diameters of the via holes by drilling with $CO_2$ laser become 10 μm larger in maximum usually, because the sides of the via holes are also cut 3~5 μm by the desmear fluid though the purpose of the desmear process is to remove the residual layer on the bottoms.

On the other hand, A method of forming a blind via hole in the resin layer of a resin-direct substrate with a UV laser, called "UV resin direct method", was disclosed in "Excimer Lasers: An emerging technology in the electronics industry" in IPC Technical Review, Pages 16–20, November 1987 and has been put to practical use. A method of forming a via hole in a substrate laminated with conductive layers and resin layers only with a UV laser was disclosed in U.S. Pat. No. 5,593,606.

The residual layer does not exist on the bottoms of via holes with the UV laser, which is different from the $CO_2$ laser method. However, if we use enough energy to obtain a practical processing speed, the surface of the conductive layer is to be also shaved by the excessive energy, and the surface roughness formed to plate firmly is melted and decomposed to a plain surface. In particular, when we use a wavelength-covert-type UV laser, whose wavelength is converted by a non-linear optical element and the like, it is easy to damage the surface of the bottom conductive layer because it is difficult to change the pulse energy during processing and the variation in the thicknesses of the resin layers is large about 20 $\mu$m compared to the resin layer thickness of 65 $\mu$m. Moreover, since the light energy reaching the bottom of the via hole is increased if the energy absorption coefficient of the resin layer is low, the stored light energy is increased just above the conductive layer. Thus, since a resin at a bottom of a via hole is decomposed and vaporized by the stored energy, and the resin layer at the bottom edge is peeled by the vapor energy. These damages can be avoided by decreasing the light pulse energy but the processing speed is decreased because the number of pulse shots must be increased.

When we process glass-containing substrates with a UV laser, the surface of the conductive layer is not only shaved by excessive energy, but the side wall of the via hole is also scooped like a barrel and the glass fibers protrude.

The following is our speculation about a cause of the excessive energy. The energy absorption coefficients at a wavelength of 355 nm in the UV light range are as follows: epoxy; 30–80%, copper; more than 70–75%, glass; about 20%. The thermal conductivity coefficients are as follows: epoxy; 0.8~0.85 $Wm^{-1}K^{-1}$, copper; 386 $Wm^{-1}K^{-1}$, glass; 1.04~1.09 $Wm^{-1}K^{-1}$. These data show the very large differences between the materials. Therefore, since about 80% of applied laser energy is stored in the via hole by being reflected or diffused, the resin side wall of the via hole is scooped like a barrel and the glass fibers protrude, especially in pulse periods less then 3.3 ms (in pulse repetition rates higher than 3 kHz), and the reliability of the process decreases.

Moreover, since the laser processing energy is higher than 3 $J/cm^2$ for drilling the conductive layer even of an RCC substrate, whose resin layer does not contain glass fibers, the difference between the material properties for the UV lights as mentioned earlier make it difficult to control the thermal conditions and the bottom surface of the conductive layer is damaged. Therefore, it is difficult to obtain the practical quality for the via holes.

In addition, since the energy spatial distribution of the UV laser beam is A'-distribution or C'-distribution, as shown in FIG. 18$a$, a roughness on the bottom is created, and the time to remove the residual layer becomes longer or the bottom surface of the conductive layer is partially damaged.

A method for avoiding the damage to the bottom surface of the conductive layer is disclosed in, for example, "Laser Ablation to sono-ouyoh," Corona Publishing co., ltd., 1999, P. 146, ll.6–13, which shows a selective resin layer etching method by setting the energy density of the processing laser light higher than the decomposition energy threshold of the resin layer and lower than the decomposition energy threshold of the conductive layer.

Here, the decomposition energy threshold is the energy density of the applied laser light that is necessary to start an ablation process, which is a decomposing, melting or vaporizing process with a laser light. The energy density of the applied laser light is a product of the applied power density and the pulse width (called a fluence).

On the other hand, a cleaning method for removing the residual materials or smears from the bottoms and the vicinity of via holes in a wide area was disclosed in Japan Pat. No. 2983481, by homogenizing an excimer laser beam widely in a line or a square distribution with a beam homogenizer device. However, when this method is applied to a resin-direct substrate, whose surface layer is a resin layer, the surface of the resin layer is damaged.

SUMMARY OF THE INVENTION

The first object of the present invention is, therefore, to provide a method for drilling printed wiring boards without a chemical desmear process by etching the residual layer selectively with laser light, which is made by measuring and utilizing the actual difference between the decomposition energy thresholds of resins and conductors.

The second object of the invention is to provide a method for drilling a substrate whose surface layer is resin, without surface damage.

The third object is to provide a suitable system to drill via holes and remove the residual layers with changing the energy densities of lasers and the wavelengths.

We found to achieve the first object that the resin layer contacting the targeted conductive layer is drilled to remain the residual layer as homogeneously as possible with a first UV laser beam whose energy density is higher than the decomposition energy threshold of the conductive layer and whose spatial energy distribution is top-hat shaped, and the residual layer is removed with a second UV laser beam whose energy density is lower than the decomposition energy threshold of the conductive layer and higher than that of the resin layer.

We empirically found the decomposition energy thresholds of materials at a wavelength of 355 nm are as follows: epoxy; 0.3~0.5 $J/cm^2$, copper; 0.8~1.0 $J/cm^2$, glass; 5~6 $J/cm^2$. The present invention succeeded, with this small difference between the decomposition energy thresholds of the epoxy resin and the copper we found, to expose the targeted conductive layer by etching the residual layer selectively with a second UV laser beam hose energy density is lower than the decomposition energy threshold of the conductive layer and higher than that of the resin layer.

Moreover, the thickness of the residual layer should be homogenized with a top-hat-shaped first UV laser beam in this method. The present invention is the best to be utilized when a top-hat-shaped first UV laser processing and a second UV laser processing, whose energy density is lower than the decomposition energy threshold of the conductive layer and higher than that of the resin layer, are combined.

To achieve the second object, the spatial energy distribution of the second UV laser beam is made top-hat-shaped, and the diameter of the beam is made coincident with the diameter of the via hole formed in the resin layer with the first laser beam to avoid the damage to the resin layer surface.

The other method for the first object is forming the hole in the conductive layer with a first UV laser beam whose energy density is higher than the decomposition energy threshold of the conductive layer, processing the resin layer with a $CO_2$ laser beam, and removing the smear with a second UV laser whose energy density is lower than the decomposition energy threshold of the conductive layer and higher than that of the resin layer, in sequence. In this embodiment, since a smear (a residual part of the resin layer) remains automatically with the $CO_2$ laser, according to our experiment as mentioned earlier, it is easy to set the process parameters because it is needless to control the residual layer thickness. Moreover, the side wall of the resin layer is not scooped like a barrel as with the UV laser process.

To achieve the third object, at least two laser paths are prepared, the spatial energy distributions are made top-hat-shaped with beam homogenizer units in the paths, and the diameters and the energy densities are adjusted independently. If the paths are switched from a laser head with, for example, an acousto-optic deflector, it is good for saving space. Moreover, if the paths are aligned to a common axis near the surface of a substrate, the processing time is shortened because the table for the substrate is not necessary to move at the time of changing the paths.

BRIEF DESCRIPTION OF THE DRAWINGS

FIG. 2b is a timing chart of motions of galvanometer mirrors and UV laser pulses for the process in FIG. 2a.

FIG. 3b is a timing chart of motions of galvanometer mirrors and UV laser pulses for the process in FIG. 3a.

FIG. 6a is a timing chart of motions of galvanometer mirrors and UV laser pulses for the process in FIG. 5a.

FIG. 8a is a timing chart of motions of galvanometer mirrors and UV laser pulses for the process in FIG. 7a.

FIG. 9a is an illustration showing an energy distribution of a $CO_2$ laser beam and drilling a hole in a resin layer of a glass-containing resin-direct substrate.

FIG. 9b is a timing chart of motions of galvanometer mirrors and $CO_2$ laser pulses for the process in FIG. 9a.

FIG. 9c is an illustration showing an energy distribution of a UV laser beam and a removing process of a residual layer in a glass-containing resin-direct substrate.

FIG. 9d is a timing chart of motions of galvanometer mirrors and UV laser pulses for the process in FIG. 9c.

FIG. 10a is an illustration showing an energy distribution of a $CO_2$ laser beam and drilling a hole in a resin layer of a resin-direct substrate.

FIG. 10b is a timing chart of motions of galvanometer mirrors and $CO_2$ laser pulses for the process in FIG. 10a.

FIG. 10c is an illustration showing an energy distribution of a UV laser beam and a removing process of a residual layer in a resin-direct substrate.

FIG. 10d is a timing chart of motions of galvanometer mirrors and UV laser pulses for the process in FIG. 10c.

FIG. 11a is an illustration showing an energy distribution of a UV laser beam and drilling a hole in a resin layer of a resin-direct substrate.

FIG. 11b is a timing chart of motions of galvanometer mirrors and UV laser pulses for the process in FIG. 11a.

FIG. 11c is an illustration showing an energy distribution of a UV laser beam and a removing process of a residual layer in a resin-direct substrate.

FIG. 11d is a timing chart of motions of galvanometer mirrors and UV laser pulses for the process in FIG. 11c.

FIG. 13b is a timing chart of motions of galvanometer mirrors and UV laser pulses for the process in FIG. 13a.

FIG. 14b is a timing chart of motions of galvanometer mirrors and UV laser pulses for the process in FIG. 14a.

DETAILED DESCRIPTION OF THE PREFERRED EMBODIMENTS (Apparatus Embodiment 1)

Figure 1:
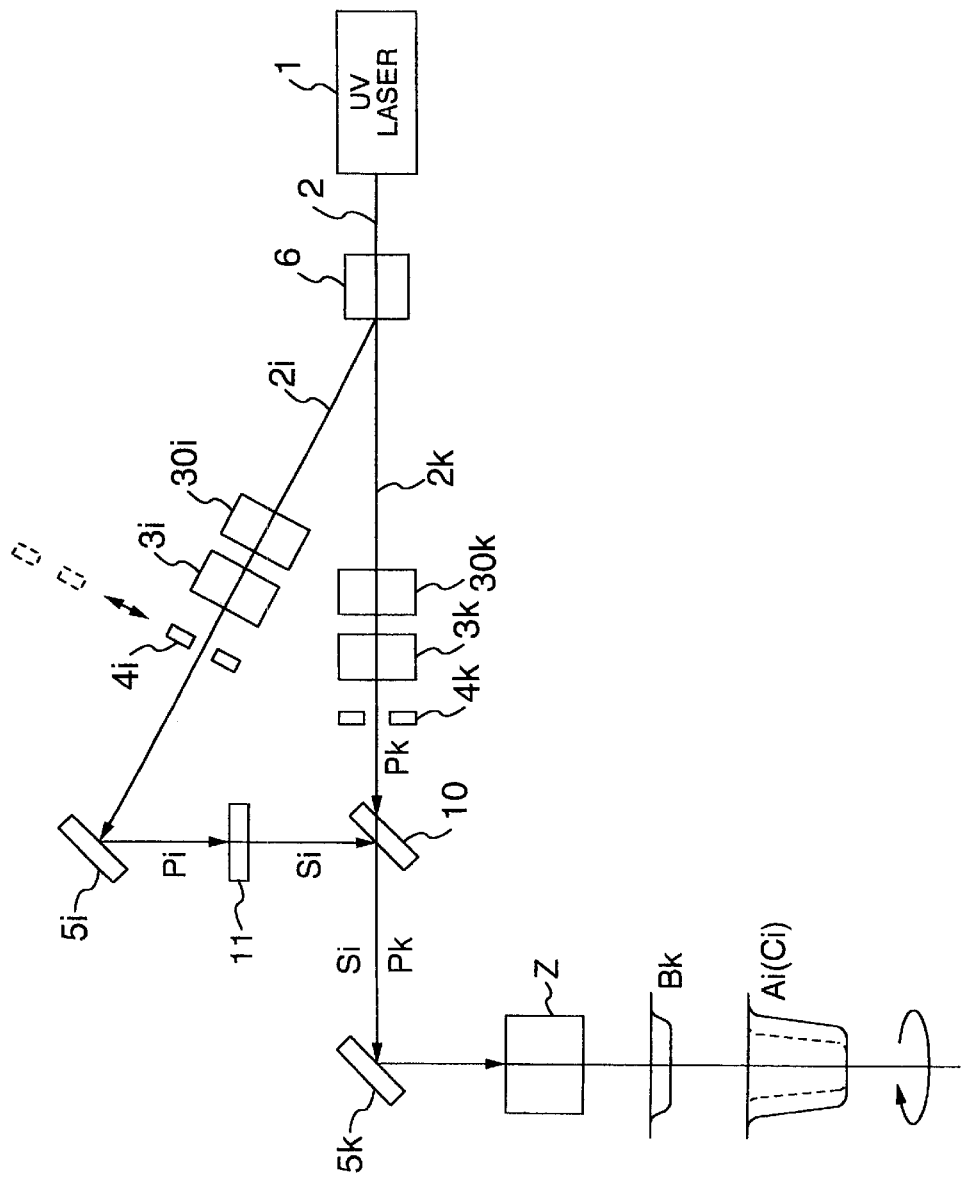
FIG. 1 is a schematic diagram of a laser machining system of the present invention.
Figure 17:
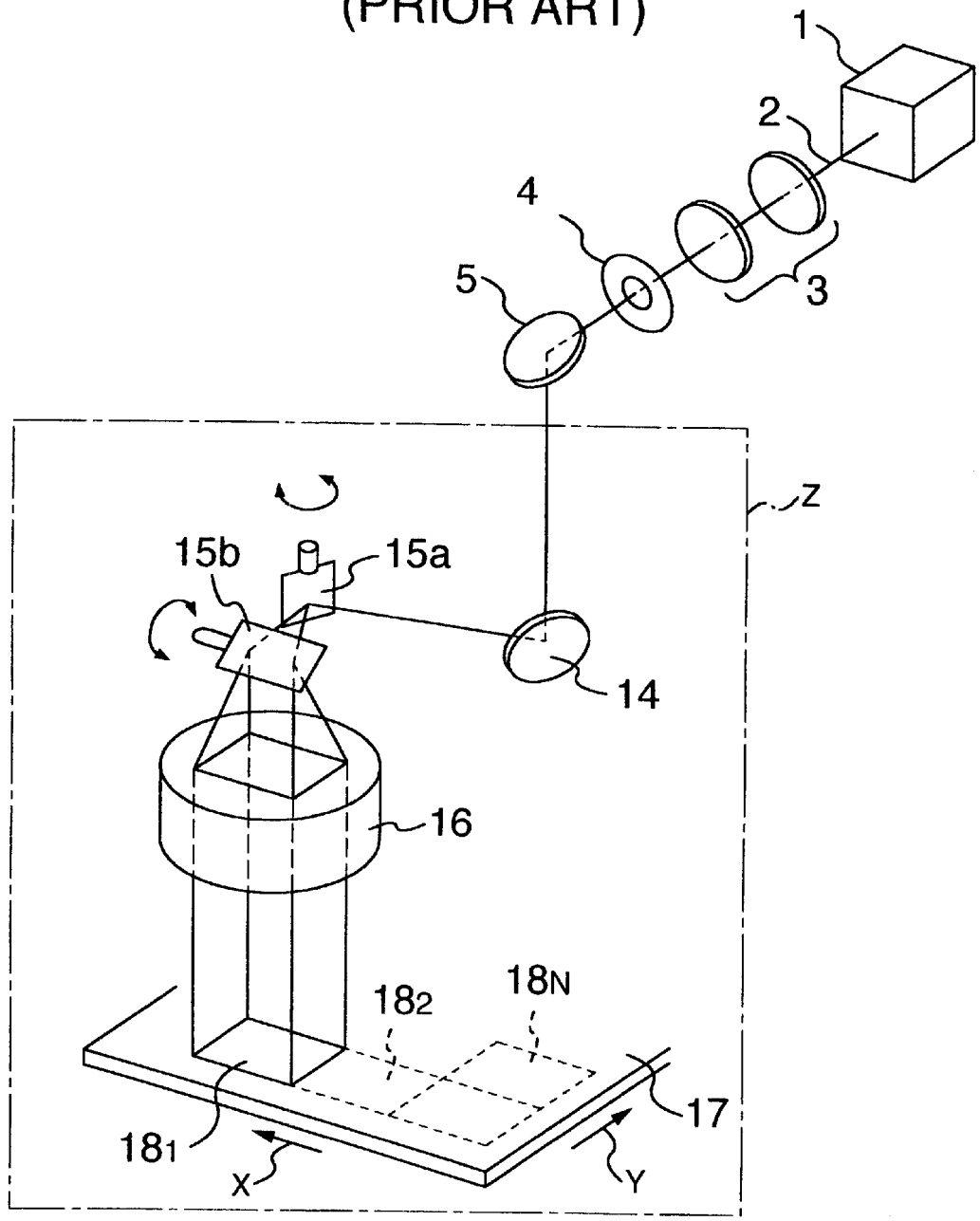
FIG. 17 is a diagram of a conventional optical system for drilling with laser light.

FIG. 1 shows a schematic diagram of a optical system of a laser machining system of the present invention. A polarizing-Q-switched $YVO_4$ laser head, whose wavelength was converted to the third harmonics (355 nm) by a non-linear optical element LBO ($LiB_3O_5$) and whose repetition frequency range was 10–100 kHz, was used as a UV laser head 1. The laser head is placed in a manner of making the electric field vector of the laser beam 2 parallel to the drawing sheet ("P-polarization"). An acousto-optic deflector 6 is set along the optical path of the laser beam 2. An acousto-optic deflector generally has an acousto-optic element bonded a piezoelectric element and is used to deflect an incident light beam by Bragg diffraction with the ultrasonic wave fronts generated by applying RF voltage to the piezoelectric element. The direction of the laser beam 2 is changed from the straightforward direction $2_k$ to the deflected direction $2_i$ with the acousto-optic deflector 6. The deflected laser beam $2_i$ is homogenized with a beam homogenizer unit $30_i$ to have a top-hat-shaped spatial energy distribution, collimated and magnified or minified with a collimator $3_i$, and shaped into a suitable diameter for machining with an aperture $4_i$. Then, the laser beam $2_i$ is reflected by a corner mirror $5_i$, and the polarization is rotated by an half-wave plate 11 in a manner of making the electric field vector of the laser beam $2_i$ perpendicular to the drawing sheet ("S-polarization"). Next, the laser beam $2_i$ is reflected by a polarizing beam combiner 10, which is an inversely operated polarizing beam splitter, and transmits P-polarization lights and reflects S-polarization lights. Then, the laser beam $2_i$ is reflected by a corner mirror $5_k$, and goes into a machining head Z, which contains two galvanometer mirrors and a f-θ lens as shown in FIG. 17. Finally, the laser beam $2_i$ is positioned with the galvanometer mirrors, condensed and perpendicularly incident on a surface of a substrate to be machined by the f-θ lens.

On the other hand, the transmitted laser beam $2_k$ is homogenized with a beam homogenizer unit $30_k$ to have a top-hat-shaped spatial energy distribution, collimated and magnified or minified with a collimator $3_k$, and shaped into a suitable diameter for machining with an aperture $4_k$. Then, the laser beam $2_k$ is transmitted through the polarizing beam combiner 10 because the laser beam $2_k$ is P-polarized ($P_k$), and the laser beam $2_k$ is reflected by a corner mirror $5_k$, and goes into a machining head Z. Finally, the laser beam $2_k$ is positioned with the galvanometer mirrors, condensed by the f-θ lens, and perpendicularly incident on a surface of a substrate to be machined. In this example, the laser beams ($2_i$ and $2k$) travel along a common optical path after the polarizing beam combiner 10.

Figure 18A:
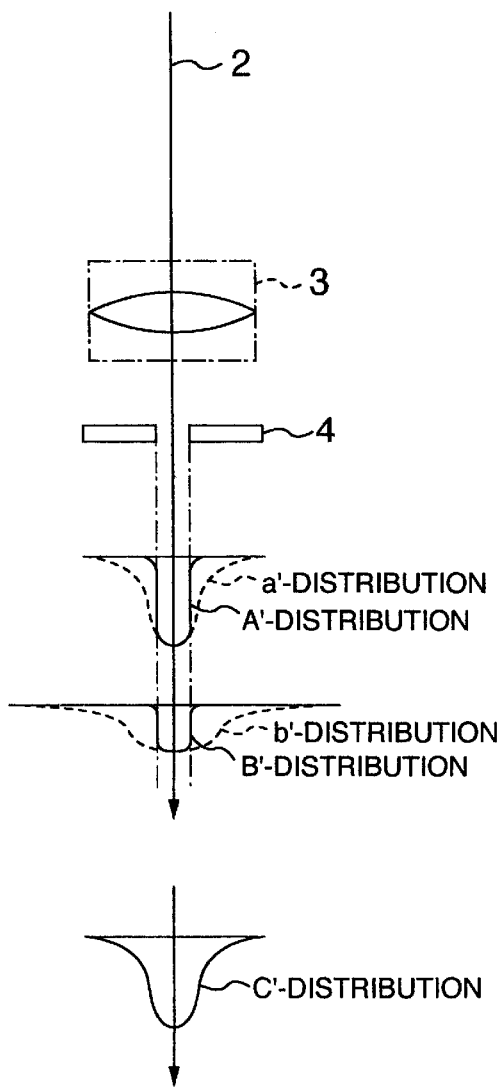
FIG. 18a is a schematic diagram showing effects of the collimator 3 and aperture 4.
Figure 18B:
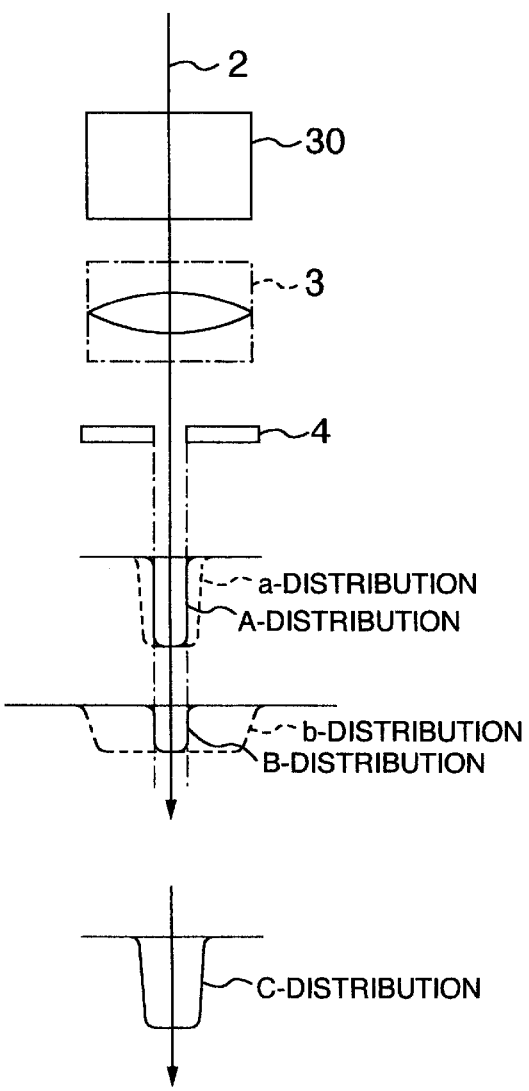
FIG. 18b is a schematic diagram showing a spatial energy distribution when a beam homogenizer 30 is used along the optical path.

Spatial energy distributions $A_i$ and $B_k$ suitable for machining can be obtained by adjusting magnifications $M_i$ and $M_k$ of the collimators $3_i$ and $3_k$ while the diameters of the apertures are kept constant (see FIG. 18b). Furthermore, by removing the aperture $4_i$ from the optical path, we can obtain the full output of $C_i$ distribution.

This is a very simplified apparatus embodiment that has dual optical paths for machining and their respective energy distribution settings are substantially independent. Therefore, the apparatus becomes compact. In addition, lights transmitted through a deflector like an acousto-optic one are put into a beam dumper and dumped as heat in a conventional system, but utilized efficiently in this apparatus embodiment. Furthermore, since the laser beams of the dual paths travel along the same optical path after the corner mirror $5_k$, no stage movement or the like is required on machining successively with the laser beams. Thus, the machining time can be shortened.

In this embodiment, if we use the acousto-optic deflector that the polarization of the incident light is rotated by 90 degrees through as the acousto-optic deflector 6, the half-wave plate 11 is eliminated because the rotation of the polarization is not required.

(Machining Embodiment 1)

Figure 2A:
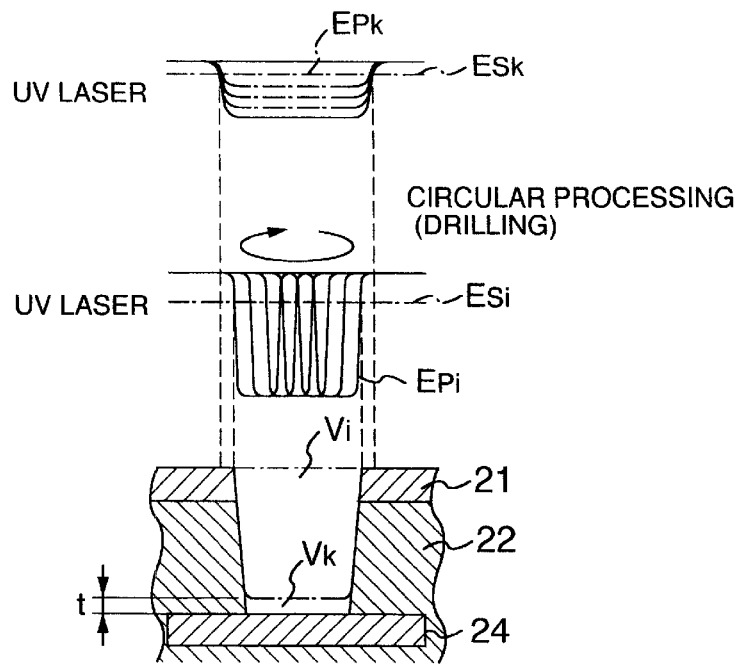
FIG. 2a is an illustration showing energy distributions of UV laser beams and thereby an extending process of a hole in an RCC substrate.
Figure 2B:
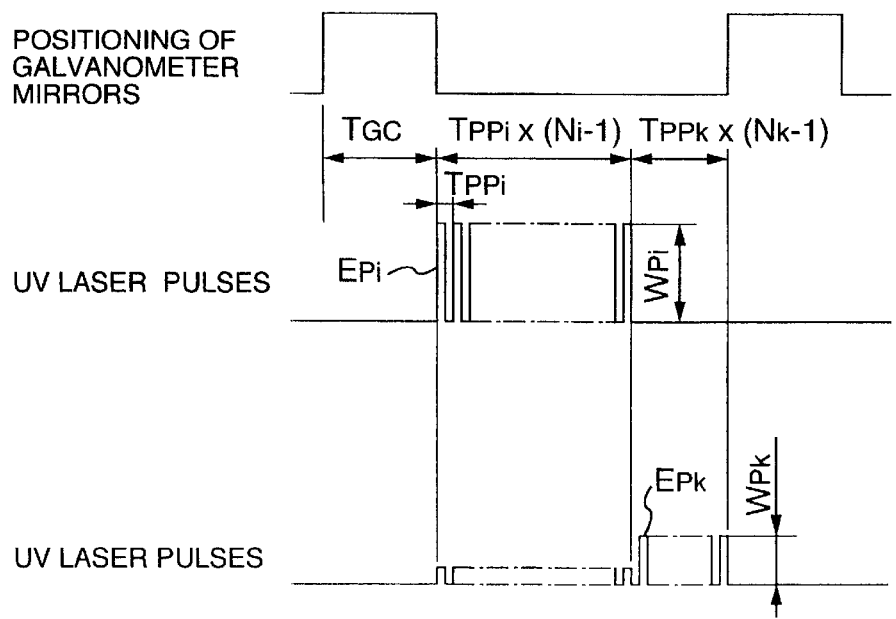

FIG. 2a shows energy distributions of UV laser beams and thereby an extending process of a hole in an RCC substrate with Apparatus Embodiment 1, and FIG. 2b is a timing chart of motions of galvanometer mirrors and UV laser pulses for the process in FIG. 2a.

Here, the notation for the physical quantities of the laser beams $2_i$ and $2_k$ is defined as follows:

$E_{Pa}$: pulse energy ($=E_{P0a} \times (d_{Aa}/d_{0a}/M_a)^2$)

$E_{P0a}$: pulse energy output from laser head
    $d_{Aa}$: diameter of aperture
    $d_{0a}$: diameter of laser beam 2a before entering 30a
    $M_a$: magnification of collimator $T_{Pa}$: pulse width $W_{Pa}$: peak output power ($=E_{Pa}/T_{Pa}$)

$E_{dSa}$: energy density ($=E_{Pa}/\{\pi(d_{Sa}/2)^2\}$)
    $d_{Sa}$: diameter of machining spot ($=d_{Aa} \times \{(L_a/f_a)-1\}$)
    $L_a$: distance between f-θ lens and work piece (substrate)
    $f_a$: focal length of f-θ lens $T_{PPa}$: period of pulse $T_{GC}$: period of positioning galvanometer mirrors $E_{sa}$: decomposition energy threshold $N_a$: number of pulsed shots $V_a$: amount of removed material
    where a subscript "a" denotes a distinction between the laser beams "i" and "k".

In FIG. 2a, the numeral 21 denotes an outer conductive (metallic) layer (9 μm in thickness) of copper, the numeral 22 denotes an insulating layer (50 μm in thickness) of epoxy resin, the numeral 24 denotes an inner conductive (metallic) layer of copper, and the symbol t denotes a residual thickness of the insulating layer after processing with a first laser beam $2_i$. First, the first laser beam $2_i$ is obtained by deflection with the acousto-optic deflector 6 by applying an RF voltage. At this step, the decomposition energy threshold $E_{Si}$ in using the first laser beam $2_i$ should be 0.8~1.0 J/cm² equal to a decomposition energy threshold of the outer conductive layer 21 (0.81–1.0 J/cm²) higher than the decomposition energy threshold of the resin layer 22 (0.3~0.5 J/cm²) Since the energy density of the laser beam 2 required for removing the conductive layer efficiently was equal to or greater than about 3.0 J/cm² according to our experiment, a strongly condensed light was required. Therefore, $C_i$ energy distribution was used for the laser beam $2_i$ in order to obtain a strong and wide beam. When pulse width $T_{Pi}$ was 25 ns, pulse period $T_{PPi}$ was 0.03 ms (30 kHz in frequency), peak output $W_{Pi}$ was 2.4–4.0 kW, pulse energy $E_{Pi}$ was 0.06–0.10 mJ, and machining spot diameter $d_{si}$ was 40 μm, we obtained the pulse energy density $E_{dSi}$ of 4.8~8.0 J/cm². We could remove almost entire thickness of the conductive layer 21 and the resin layer with the laser beam. Additionally, a multi-pulsed processing in a circular positioning of the beam spot ("circular processing" or "trepanning" as shown by an arrow in FIG. 2a) was required for forming a window of 100 μm in diameter in the conductive layer of 9 μm in thickness, because the machining beam spot was smaller than the window. In this case, the required total number $N_i$ of pulsed shots was 100. Here, the preferable residual thickness (t) of the resin layer was 5~10 μm. Since the spatial energy distribution of the first laser beam $2_i$ was top-hat-shaped, the residual thickness was substantially uniform.

The residual thickness (t) of the resin layer 22 was removed with a second laser beam $2_k$, which was obtained by turning off the RF voltage from the acousto-optic deflector 6. The energy density of the UV laser beam $2_k$ required for removing the residual thickness of the resin layer of the hole bottom was greater than 0.3~0.5 J/cm² (practically equal to or greater than 0.5 J/cm²). The top-hat-shaped $B_k$ distribution was employed to remove the residual resin layer uniformly, to remove an oxidized layer formed on the surface of the inner conductive layer for improving a peel strength of the resin layer, and not to damage the inner conductive layer substantially. Moreover, if the pulse energy $E_{Pk}$ of the second laser beam $2_k$ is higher than the decomposition energy threshold $E_{Sk}$, which is equal to the decomposition energy threshold the resin layer, and lower than the decomposition energy threshold of the inner conductive layer 24, there is no damage to the inner conductive layer 24. Therefore, pulse width $T_{Pk}$ of 25 ns, pulse period $T_{PPk}$ of 0.03 ms (30 kHz in frequency), peak output $W_{Pk}$ of 2.3~3.6 kW, and pulse energy $E_{Pk}$ of 0.06~0.09 mJ were employed, and the machining spot diameter $d_{Sk}$ of 120 μm, which is larger than the widow diameter of 100 μm, was also employed. Thus, we obtained the pulse energy density $E_{dSk}$ of 0.5~0.8 J/cm². Under this condition, the residual thickness of the resin layer could be removed because the energy density was higher than the practically required decomposition energy threshold of 0.5~0.8 J/cm² for the resin layer of epoxy, and the inner conductive layer could not be damaged because the energy density was lower than the decomposition energy threshold of 0.8~1.0 J/cm2 of copper, the material of the inner conductive layer. The removing speed of the resin layer in this embodiment was about 0.5 μm/pulse, and the required number of pulse $N_k$ was 30.

FIG. 2b shows a timing chart of this method. It can be seen that the weakened second laser beam $2_k$ was combined with the first laser beam $2_i$, during the time when the machining was performed with the first laser beam $2_i$, because the diffraction efficiency of the acousto-optic device was not 100%. However, since the amount of the weakened second laser beam was lower than the decomposition energy threshold of the resin, there was no deterioration in machining with the first laser beam $2_i$.

According to this embodiment, no delaminations between the conductive layers and the resin layers along the edges of via hole bottoms occurred. Additionally, in some cases, decomposition debris remained slightly on a via hole bottom of a conductive layer. However, this caused no problem because the debris can be removed together with oxidized layers or like on the surface of the inner conductive layer, by chemical light-etching which is the first step of the plating process to be performed after the laser beam machining.

(Machining Embodiment 2)

Figure 3A:
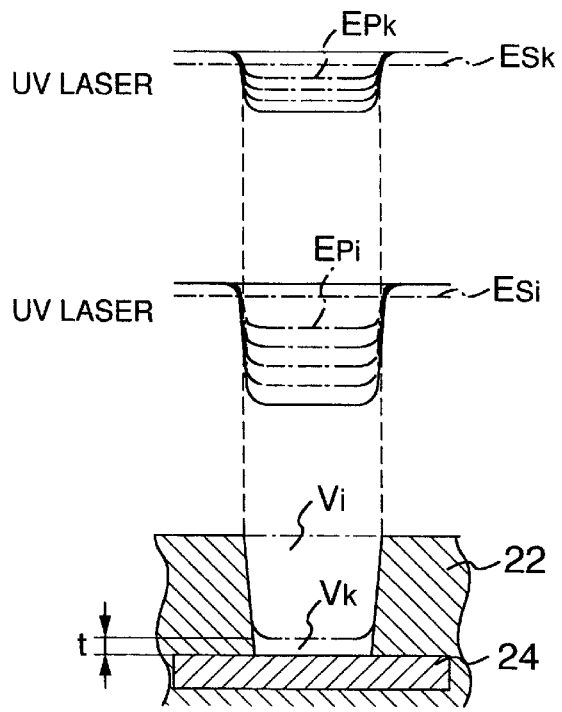
FIG. 3a is an illustration showing energy distributions of UV laser beams and thereby an extending process of a hole in a resin-direct substrate.
Figure 3B:
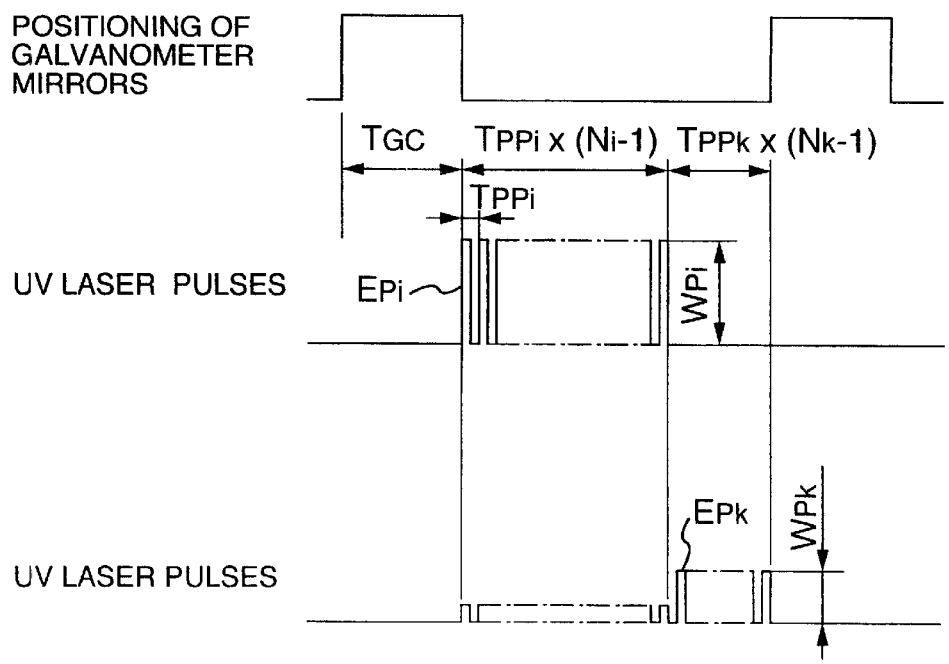

FIG. 3a shows energy distributions of UV laser beams and thereby an extending process of a hole in a resin-direct substrate, whose entry material is epoxy resin, with Apparatus Embodiment 1, and FIG. 3b is a timing chart of motions of galvanometer mirrors and UV laser pulses for the process in FIG. 3a. In FIG. 3a, the numeral 22 denotes an insulating layer (50 μm in thickness) of epoxy resin, the numeral 24 denotes an inner conductive (metallic) layer of copper, and the symbol t denotes a residual thickness of the insulating layer after processing with a first laser beam $2_i$. Here, the decomposition energy threshold $E_{Si}$ in using the first laser beam $2_i$ is the decomposition energy threshold of the resin layer 22 of epoxy, that is 0.3~0.5 J/cm².

In this embodiment, the conditions were almost identical to the machining embodiment 1, except for the following differences.

Since the energy density of the laser beam $2_i$ required for removing the resin layer was lower than that required for removing the conductive layer, $A_i$ energy distribution was. When pulse width $T_{Pi}$ was 25 ns, pulse period $T_{PPi}$ was 0.03 ms (30 kHz in frequency), peak output $W_{Pi}$ was 1.0~1.6 kW, pulse energy $E_{Pi}$ was 0.025~0.040 mJ, and machining spot diameter $d_{Si}$ was 50 μm, we obtained the pulse energy density $E_{dSi}$ of 1.3~2.0 J/cm², for removing almost entire thickness of the resin layer with the laser beam. The required total number $N_i$ was 100. The preferable residual thickness (t) of the resin layer was 5~10 μm. Since the spatial energy distribution of the first laser beam $2_i$ was top-hat-shaped, the residual thickness was substantially uniform.

The residual thickness (t) of the resin layer 22 was removed with a second laser beam $2_k$ having top-hat-shaped $B_k$ distribution. The pulse width $T_{Pk}$ of 25 ns, pulse period $T_{PPk}$ of 0.03 ms (30 kHz in frequency), and peak output $W_{Pk}$ of 0.4~0.6 kW were employed. In this embodiment, unlike the machining embodiment 1, the machining spot diameter $d_{Sk}$ of 120 μm, which is larger than the widow diameter was set at 50 μn, which was identical to the hole diameter with the first laser beam, in order to prevent damage of the other part. Thus, the pulse energy was reduced to 0.010~0.016 mJ, and the pulse energy density $E_{dSk}$ became 0.5~0.8 J/cm². The removing speed of the resin layer in this embodiment was about 0.5 μm/pulse, and the required number of pulse $N_k$ was 15.

(Apparatus Embodiment 2)

Figure 4:
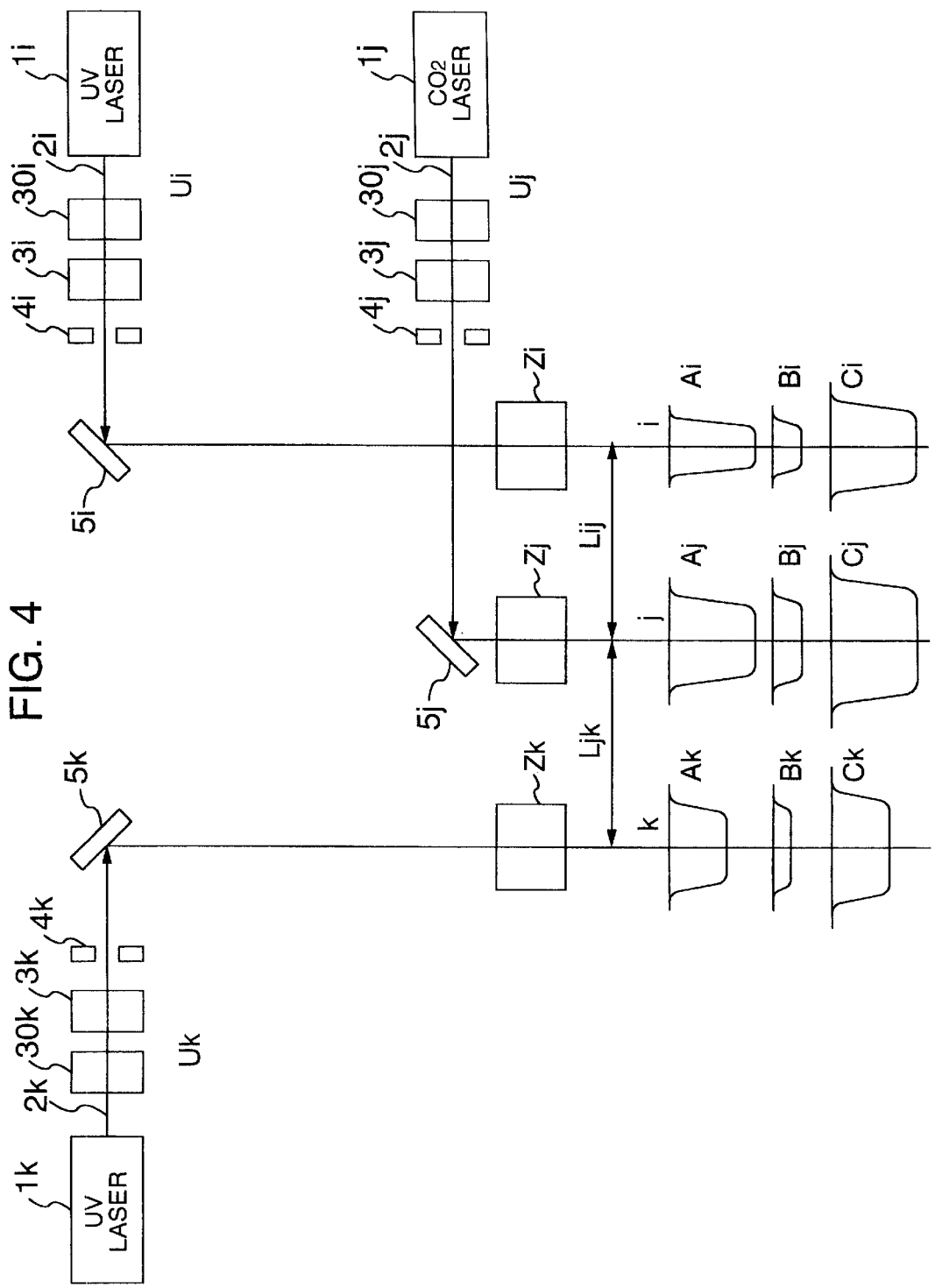
FIG. 4 is a schematic diagram of another laser machining system of the present invention.

FIG. 4 is a schematic diagram of another laser machining system as Apparatus Embodiment 2 of the present invention, in which the resin layer can be removed with a $CO_2$ laser after a window is drilled with a UV laser. A UV laser beam $2_i$ emitted from a UV laser head th goes through a beam homogenizer unit $30_i$, then the diameter of the beam $2_i$ is magnified or minified with a collimator $3_i$, shaped into a suitable diameter for machining with an aperture $4_i$, and the laser beam $2_i$ is reflected by a corner mirror $5_i$, goes into a machining head $Z_i$. Then the laser beam $2_i$ is positioned, condensed and perpendicularly incident on a surface of a substrate to be machined with the machining head $Z_i$.

A $CO_2$ laser beam $2_j$ emitted from a $CO_2$ laser head $1_j$ goes through a beam homogenizer unit $30_j$, then the diameter of the beam $2_j$ is magnified or minified with a collimator $3_j$, shaped into a suitable diameter for machining with an aperture $4_j$, and the laser beam $2_j$ is reflected by a corner mirror $5_j$, goes into a machining head $Z_j$. Then the laser beam $2_j$ is positioned, condensed and perpendicularly incident on a surface of a substrate to be machined with the machining head $Z_j$.

A UV laser beam $2_k$ emitted from a UV laser head $1_k$ goes through a beam homogenizer unit $30_k$, then the diameter of the beam $2_k$ is magnified or minified with a collimator $3_k$, shaped into a suitable diameter for machining with an aperture $4_k$, and the laser beam $2_k$ is reflected by a corner mirror $5_k$, goes into a machining head $Z_k$. Then the laser beam $2_k$ is positioned, condensed and perpendicularly incident on a surface of a substrate to be machined with the machining head $Z_k$.

Each spatial energy distribution of the laser beams $2_i$, $2_j$, and $2_k$ can be homogenized from Gaussian distribution to top-hat-shaped distribution, by adjusting the beam homogenizer units $30_i$, $30_j$, and $30_k$, respectively.

Additionally, by altering the aperture diameters $d_{Ai}$, $d_{Aj}$, and $d_{Ak}$, the diameters $d_{Si}$, $d_{Sj}$, and $d_{Sk}$ of machining beams on the work piece surface can be changed respectively, while the energy densities thereof are kept constant.

Furthermore, various spatial energy distributions $A_i$, $B_i$, $A_j$, $B_j$, $A_k$, and $B_k$ can be obtained by altering magnification $M_i$, $M_j$, and $M_k$ of the collimators $3_i$, $3_j$, and $3_k$ respectively, while the aperture diameters $d_{Ai}$, $d_{Aj}$, and $d_{Ak}$ are kept constant. Moreover, by removing the apertures from the optical paths, the spatial energy distributions $C_i$, $C_j$, and $C_k$ of full outputs can be obtained respectively.

Additionally, each of the machining heads $Z_i$, $Z_j$, and $Z_k$ can perform machining successively, and each machinable range is sufficient for machining the whole region of a printed wiring board. Then, the machining heads are arranged linearly on the laser beam machining apparatus, distances $L_{ij}$, $L_{jk}$ between the machining axes of the heads respectively are minimized, and each head can process the same printed wiring board on the table.

(Machining Embodiment 3)

Figure 5A:
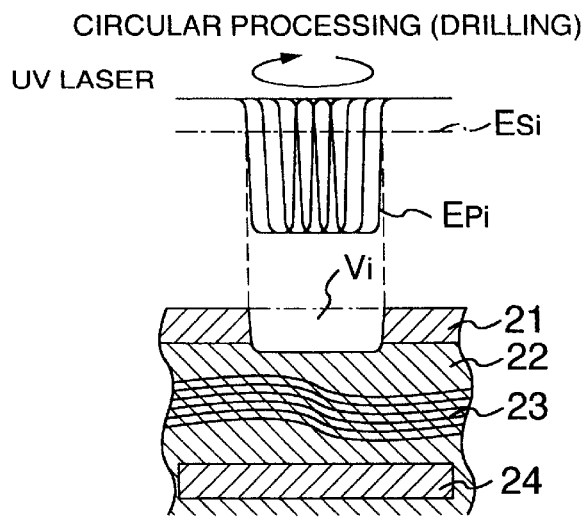
FIG. 5a is an illustration showing an energy distribution of a UV laser beam and drilling a hole in a conductive layer by circular processing in a glass-containing substrate.
Figure 5B:
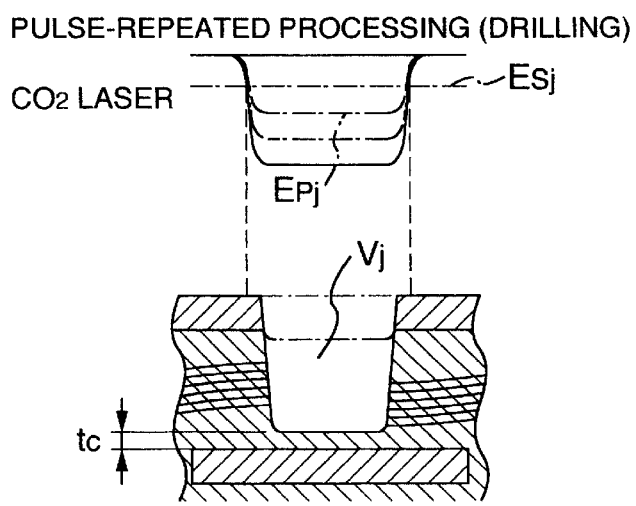
FIG. 5b is an illustration showing an energy distribution of a $CO_2$ laser beam and drilling a hole in a resin layer by pulse-repeated processing in a glass-containing substrate.
Figure 5C:
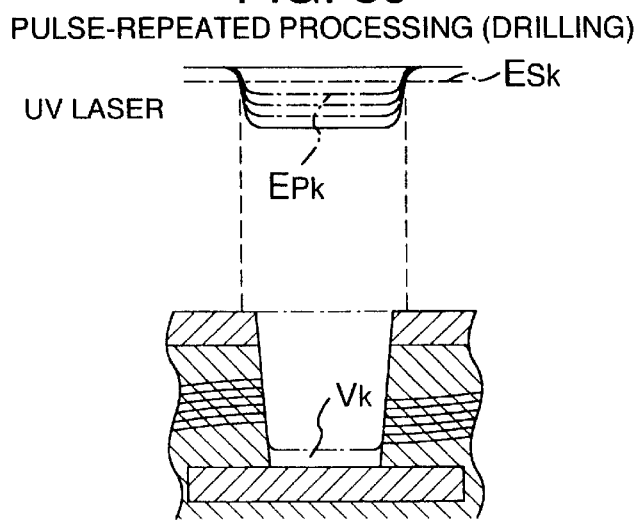
FIG. 5c is an illustration showing an energy distribution of a UV laser beam and a removing process of a residual layer in a glass-containing substrate.
Figure 6A:
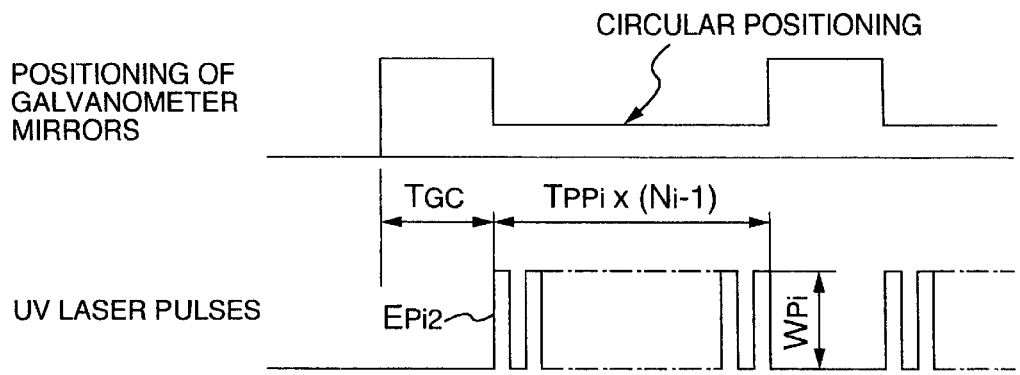
Figure 6B:
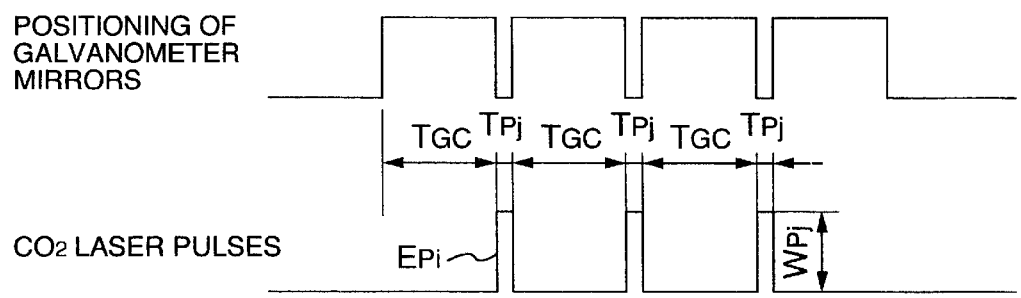
FIG. 6b is a timing chart of motions of galvanometer mirrors and $CO_2$ laser pulses for the process in FIG. 5b.
Figure 6C:
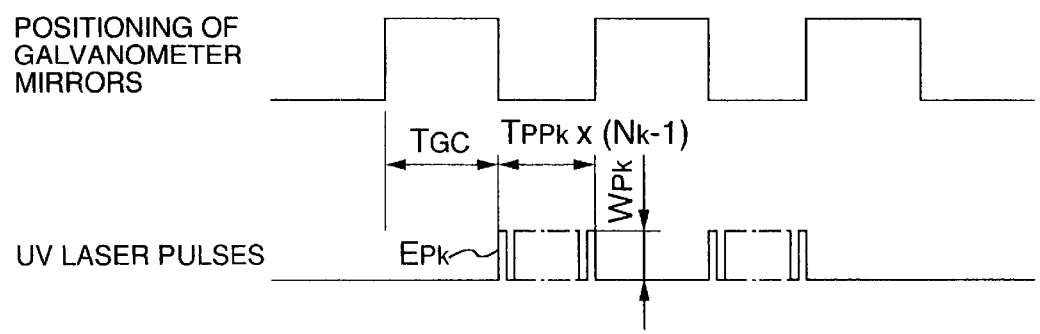
FIG. 6c is a timing chart of motions of galvanometer mirrors and UV laser pulses for the process in FIG. 5c.

FIGS. 5a, 5b, and 5c are illustrations showing energy distributions of UV and $CO_2$ laser beams, and drilling a hole in a glass-containing substrate with Apparatus Embodiment 2. FIGS. 6a, 6b, and 6c are timing charts of motions of galvanometer mirrors and UV and $CO_2$ laser pulses for the process in FIG. 5a, 5b, and 5c, respectively.

An outer conductive layer 21 (9 μm in thickness) was removed with a laser beam $2_i$ of a pulse energy $E_{Pi}$ higher than the decomposition energy threshold $E_{Si}$, as shown in FIG. 5a. Here, the laser beam $2_i$ of $C_i$ distribution, pulse width $T_{Pi}$ of 30 ns, pulse period $T_{PPi}$ of 0.04 ms (25 kHz in frequency), peak output $W_{Pi}$ of 4 kW, pulse energy $E_{Pi}$ of 0.12 mJ, machining spot diameter $d_{Si}$ 60 μm, and pulse energy density $E_{dSi}$ of 4 J/cm2 were used. Under these conditions, we obtained the practically required energy density of not lower than 3 J/cm2, which was obtained empirically, for removing the conductive layer. Furthermore, a circular processing was required for forming a window of 100 μm in diameter, because the machining beam spot was smaller than the window. In this case, the required total number $N_i$ of pulsed shots was 80.

As shown in FIG. 5b, almost entire thickness of an resin layer 22 containing glass fibers 23 (50 μm in thickness) was removed with a $CO_2$ laser beam $2_j$ with $C_j$ distribution, pulse width $T_{Pj}$ of 10 μs, peak output $W_{Pj}$ of 800 W, pulse energy $E_{Pj}$ of 8 mJ, machining spot diameter $d_{Sj}$ of 150 μm, which was larger than the window diameter of 100 μm, and pulse energy density $E_{dSj}$ of 45 J/cm$^2$. The number of pulses was 3. Under these conditions, almost entire thickness of the resin layer was removed, but a smear of thickness ($t_c$) 0.1~3 μm of the resin layer remained on the hole bottom.

As shown in FIG. 5c, the smear was removed with a laser beam $2_k$ with $B_k$ distribution, pulse width $T_{Pk}$ of 30 ns, pulse period $T_{PPk}$ of 0.04 ms (25 kHz in frequency), peak output $W_{Pk}$ of 4 kW, pulse energy $E_{Pk}$ of 0.12 mJ, machining spot diameter $d_{Sk}$ of 150 μm, which was larger than the window diameter of 100 μm, and pulse energy density $E_{dSk}$ of 0.7 J/cm$^2$. The removing speed of the resin layer was about 0.5 μm/pulse, and the required number of pulses was 10~15.

Using this Machining Embodiment 3, conductive layers and resin layers containing glass fibers can be machined most efficiently. Additionally, the total energy amount of the UV laser beam arriving at the via hole bottom is about 0.55 mJ (≈0.12 mJ×10 shots×($\phi$100/$\phi$150)$^2$) of less than about 10% of the total energy 6 mJ (~0.12×50 shots) required for machining the whole resin layer only with the second laser beam. Therefore, there are no damage to the hole bottom and no delamination between the conductive layer and the resin layer at the bottom edge, even if the material of the resin layer has low absorption coefficient for the UV laser. Additionally, the residual thickness (the smear thickness) after machining with $CO_2$ laser beam $2_j$ did not vary, even if the thickness of the resin layer varied. Therefore, the reliability of machining was improved in this machining embodiment.

(Machining Embodiment 4)

Figure 7A:
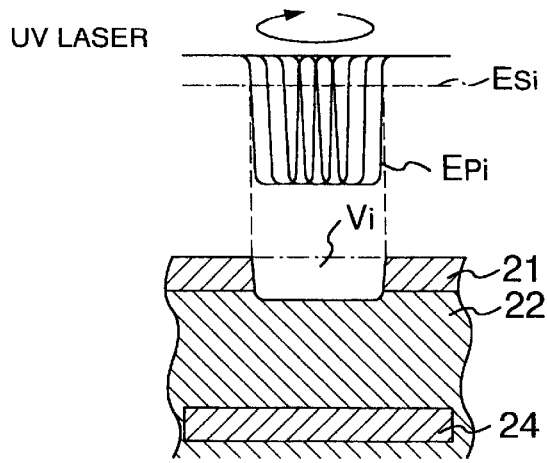
FIG. 7a is an illustration showing an energy distribution of a UV laser beam and drilling a hole in a conductive layer by circular processing in an RCC substrate.
Figure 7B:
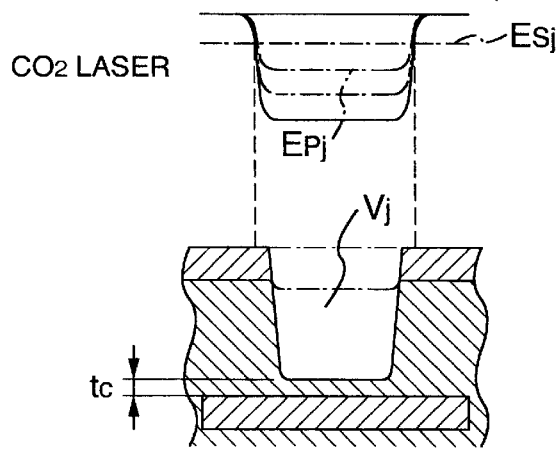
FIG. 7b is an illustration showing an energy distribution of a $CO_2$ laser beam and drilling a hole in a resin layer by pulse-repeated processing in an RCC substrate.
Figure 7C:
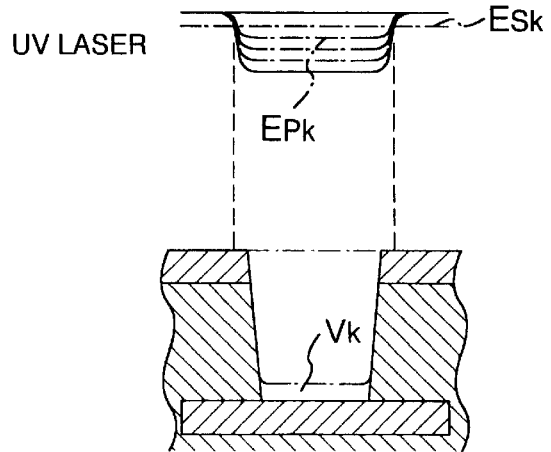
FIG. 7c is an illustration showing an energy distribution of a UV laser beam and a removing process of a residual layer in an RCC substrate.
Figure 8A:
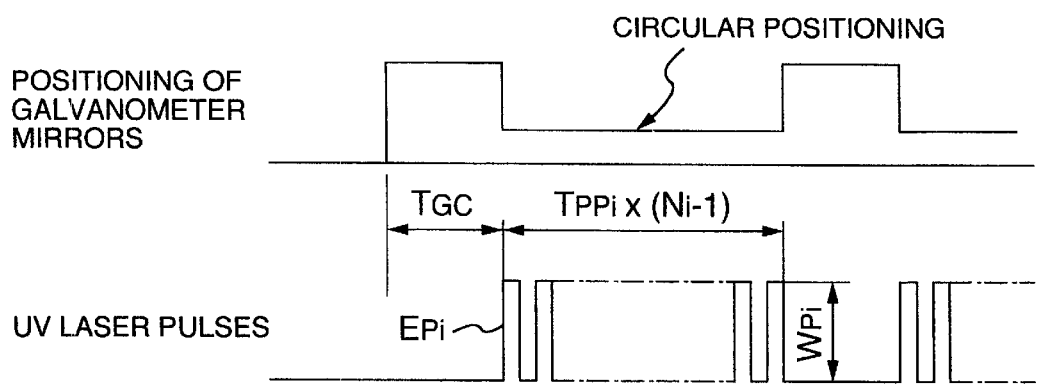
Figure 8B:
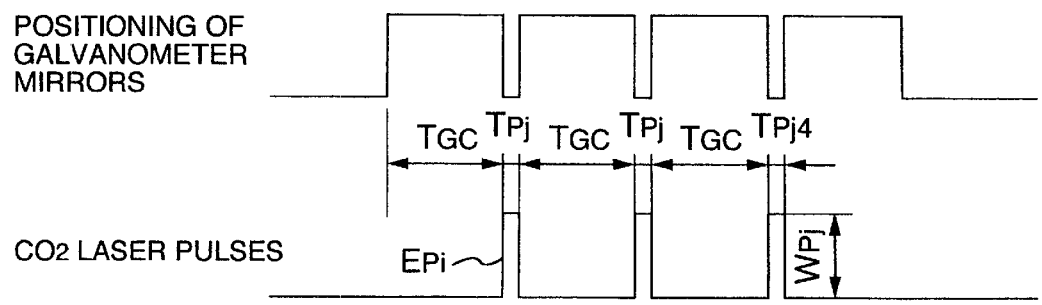
FIG. 8b is a timing chart of motions of galvanometer mirrors and $CO_2$ laser pulses for the process in FIG. 7b.
Figure 8C:
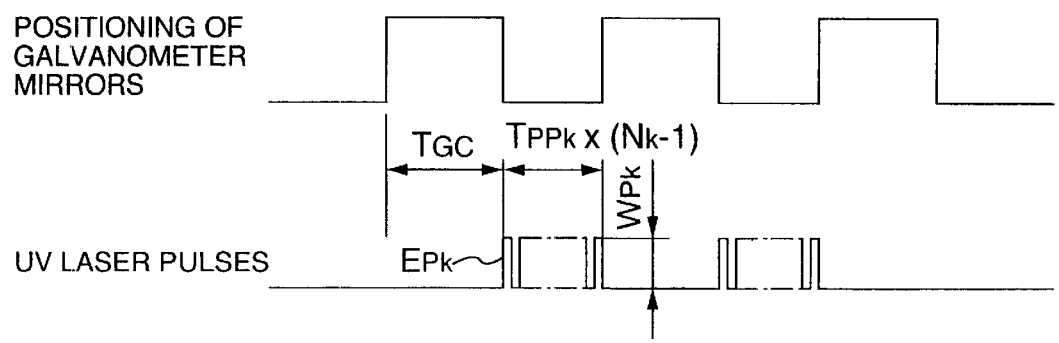
FIG. 8c is a timing chart of motions of galvanometer mirrors and UV laser pulses for the process in FIG. 7c.

FIGS. 7a, 7b, and 7c are illustrations showing energy distributions of UV and $CO_2$ laser beams, and drilling a hole in a RCC substrate with Apparatus Embodiment 2. FIGS. 8a, 8b, and 8c are timing charts of motions of galvanometer mirrors and UV and $CO_2$ laser pulses for the process in FIGS. 7a, 7b, and 7c, respectively.

An outer conductive layer 21 was machined as shown in FIG. 7a, the same as FIG. 5a of Machining Embodiment 3. As shown in FIG. 7b, almost entire thickness of an resin layer 22 was removed with the $CO_2$ laser beam $2_j$ with $B_j$ distribution, pulse width $T_{Pj}$ of 10 ms, peak output $W_{Pj}$ of 500 W, pulse energy $E_{Pj}$ of 5 mJ, which is lower then the value in Machining Embodiment 3 because the decomposition energy threshold of the resin layer was lower than that of the glass-fiber-containing resin layer.

We used the machining spot diameter $d_{Sj}$ of 150 μm, which was larger than the window diameter of 100 μm, thus the pulse energy density $E_{dSj}$ of 30 J/cm$^2$ was obtained, which was higher than 10 J/cm2 obtained empirically as the lower limit of the practically required energy density for removing the resin layer.

Under these conditions, almost entire thickness of the resin layer was removed by 1~2 shots of the laser beam $2_k$, though a smear of thickness ($t_c$) 0.1~3 m remained on the hole bottom. The smear was removed as shown in FIG. 7c, the same as FIG. 5c of Machining Embodiment 3.

(Machining Embodiment 5)

FIGS. 9a and 9c are illustrations showing energy distributions of $CO_2$ and UV laser beams, and drilling a hole in a resin layer of a glass-containing resin-direct ("FR-4") substrate with Apparatus Embodiment 2. FIGS. 9b and 9d are timing charts of motions of galvanometer mirrors and $CO_2$ and UV laser pulses for the process in FIGS. 9a and 9c, respectively.

In machining the FR-4substrate without any outer conductive layer, an outer resin layer 22 containing glass-fibers 23 was machined as shown in FIG. 9a, the same as FIG. 5b of Machining Embodiment 3, except that the entrance diameter of a hole was determined by the spatial energy distribution of the laser beam $2_j$ and the decomposition energy threshold $E_{Sj}$ of the resin layer. The residual thickness (the smear thickness) of the resin layer 22 on the hole bottom was removed with the laser beam $2_k$, as shown in FIG. 9c, the same as FIG. 5c of Machining Embodiment 3.

(Machining Embodiment 6)

FIGS. 10a and 10c are illustrations showing energy distributions of $CO_2$ and UV laser beams and drilling a hole in a resin layer of a resin-direct substrate with Apparatus Embodiment 2. FIGS. 10b and 10d are timing charts of motions of galvanometer mirrors and $Co_2$ and UV laser pulses for the process in FIGS. 10a and 10d, respectively.

In machining the resin-direct substrate without any outer conductive layer, an outer resin layer 22 was machined as shown in FIG. 10a, the same as FIG. 7b of Machining Embodiment 4, except that the entrance diameter of a hole was determined by the spatial energy distribution of the laser beam $2_j$ and the decomposition energy threshold $E_{Sj}$ of the resin layer. The residual thickness (the smear thickness) of the resin layer 22 on the hole bottom was removed with the laser beam $2_k$, as shown in FIG. 10c, the same as FIG. 7c of Machining Embodiment 4.

(Machining Embodiment 7)

FIGS. 11a and 11c are illustrations showing energy distributions of UV lasers and drilling a hole in a resin layer of a resin-direct or FR-4substrate with Apparatus Embodiment 2. FIGS. 11b and 11d are timing charts of motions of galvanometer mirrors and UV laser pulses for the process in FIGS. 11a and 11c.

In machining the resin-direct substrate without any outer conductive layer, an outer resin layer 22 was machined with a first UV laser beam of $B_i$ distribution instead of a $CO_2$ laser beam $2_j$, as shown in FIG. 11a. The pulse energy $E_{Pi}$ was adjusted to make the residual thickness (t) of 5~10 µm remain, taking account of the material and the variation in the thickness of the resin layer. The residual thickness on the bottom was removed with the laser beam $2_k$ as shown in FIG. 11c.

(Apparatus Embodiment 3)

Figure 12:
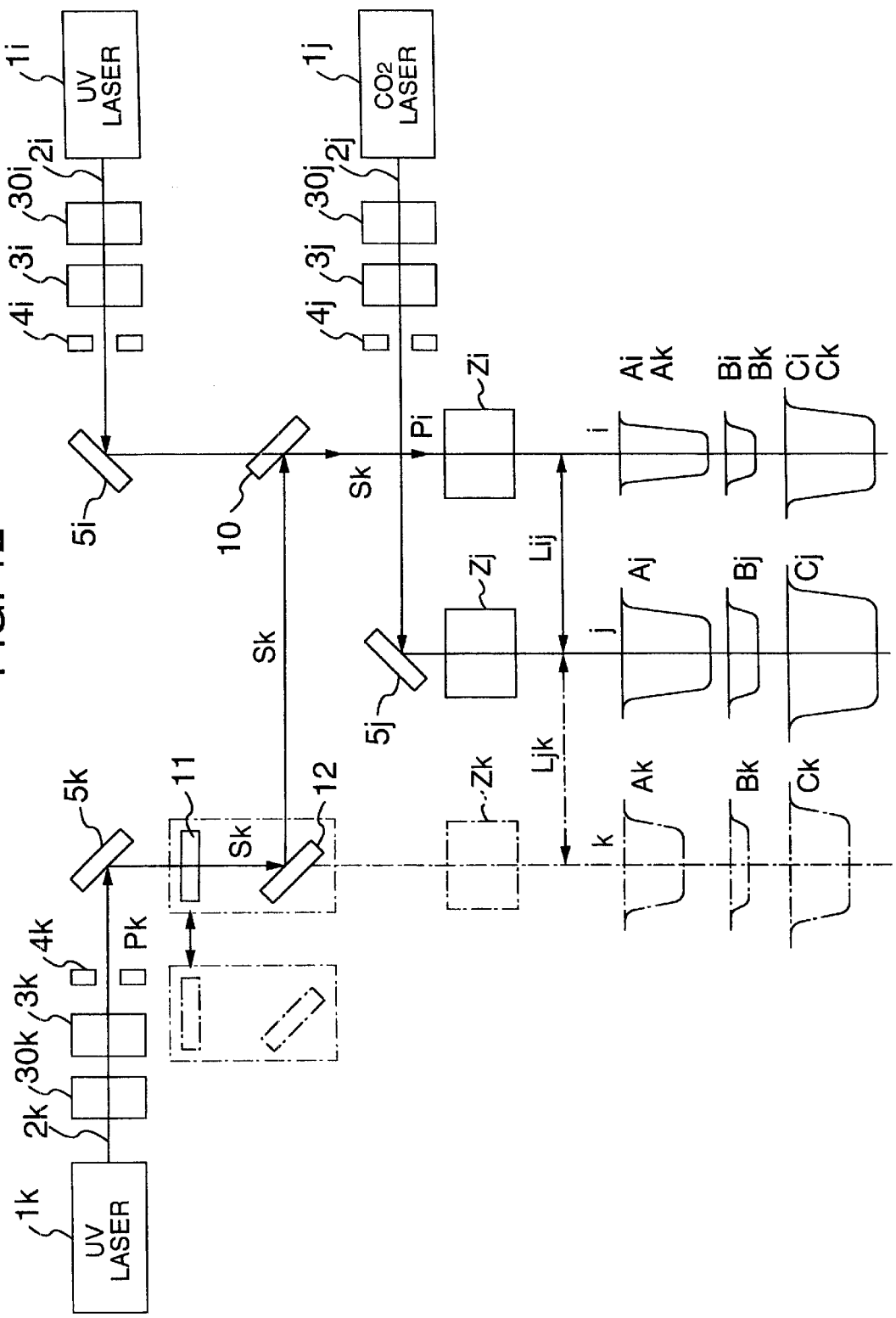
FIG. 12 is a schematic diagram of another laser machining system of the present invention.

FIG. 12 is a schematic diagram of another laser machining system as the third apparatus embodiment of the present invention, wherein the same elements as those shown in FIG. 4 are denoted with the same numerals.

The numeral 10 denotes a polarizing beam combiner placed along the optical path of the laser beam $2_i$, the numeral 11 denotes a half-wave plate placed along the optical path of the laser beam $2_k$, and the numeral 12 denotes a corner mirror. The corner mirror 12 reflects the laser beam $2_k$ to travel the same path of the laser beam $2_i$ transmitted through the polarizing beam combiner 10. Additionally, the polarization directions and the initial optical paths of the UV laser beams emitted from the laser heads $1_i$ and $1_k$ are aligned parallelly. Thus, P-polarization $P_i$ of the laser beam $2_i$ with $B_i$ distribution and S-polarization $S_k$ of the laser beam $2_k$ with $B_k$ distribution are obtained along the common optical path after the polarization beam combiner 10, simultaneously or alternately. That is, the beams having different energy densities, power densities, and spot diameters can be applied to the machining part through the common machining head $Z_i$ and path. Additionally, by removing the half-wave plate 11 and the corner mirror 12 from the optical path, the laser beam $2_i$ and the laser beam $2_k$ can perform machining simultaneously and individually, as in FIG. 4 of Apparatus Embodiment 2.

On the other hand, if the laser heads $1_i$ and $2_i$ are placed in a manner that the electric vector of the laser beam $2_i$ directs parallel to the drawing sheet and the electric vector of the laser beam $2_k$ directs perpendicular to the drawing sheet, the polarization directions of the laser beams $2_i$ and $2_k$ become P-polarization and S-polarization respectively without the half-wave plate 11. Therefore, the half-wave plate 11 in FIG. 12 can be eliminated in this case.

(Machining Embodiment 8)

Figure 13A:
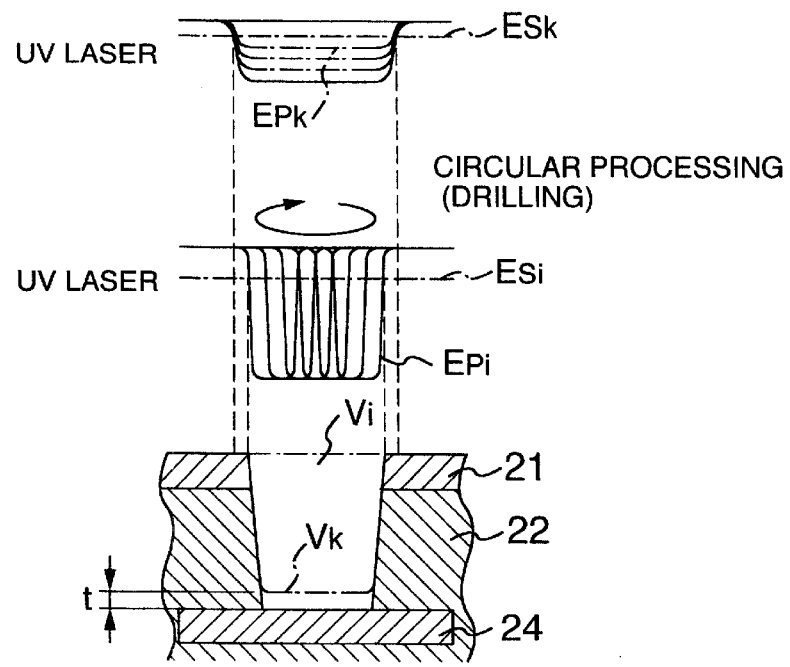
FIG. 13a is an illustration showing energy distributions of UV laser beams and thereby an extending process of a hole in an RCC substrate.
Figure 13B:
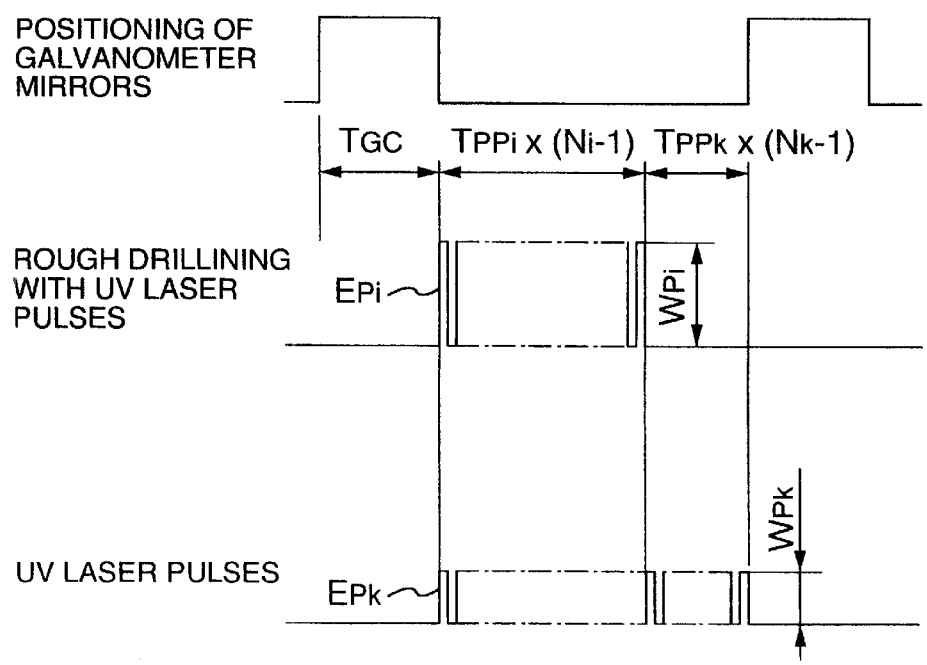

FIG. 13a is an illustration showing energy distributions of UV laser beams and thereby an extending process of a hole in an RCC substrate with Apparatus Embodiment 3. FIG. 13b is a timing chart of motions of galvanometer mirrors and UV laser pulses for the process in FIG. 13a.

The conductive layer and almost all of the resin layer was removed with the combined laser beam of the laser beam $2_i$ of $C_i$ distribution and a sufficient energy density for removing the conductive layer and the resin layer, and the laser beam $2_k$ of $B_k$ distribution and an energy density sufficient for removing the resin layer but less than for damaging the conductive layer. The residual thickness of 10 µm of the resin layer was left on the hole bottom, and then the residual thickness was removed with the single laser beam $2_k$ successively. The conductive layer and the resin layer was removed, and not affected by the variation in thickness of the resin layers by selecting the residual thickness. As a result, blind via holes were formed without any damage on the hole bottom and the hole quality was improved. Furthermore, the total pulse period of 0.012 seconds (25 kHz and 300 shots) after positioning the galvanometer mirrors did not vary due to the simultaneous machining with the combined laser beam.

(Machining Embodiment 9)

Figure 14A:
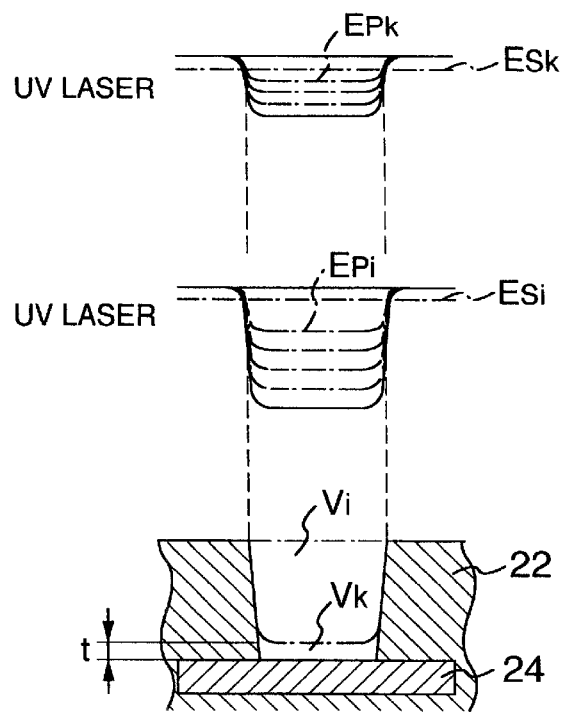
FIG. 14a is an illustration showing energy distributions of UV laser beams and thereby an extending process of a hole in a resin-direct substrate.
Figure 14B:
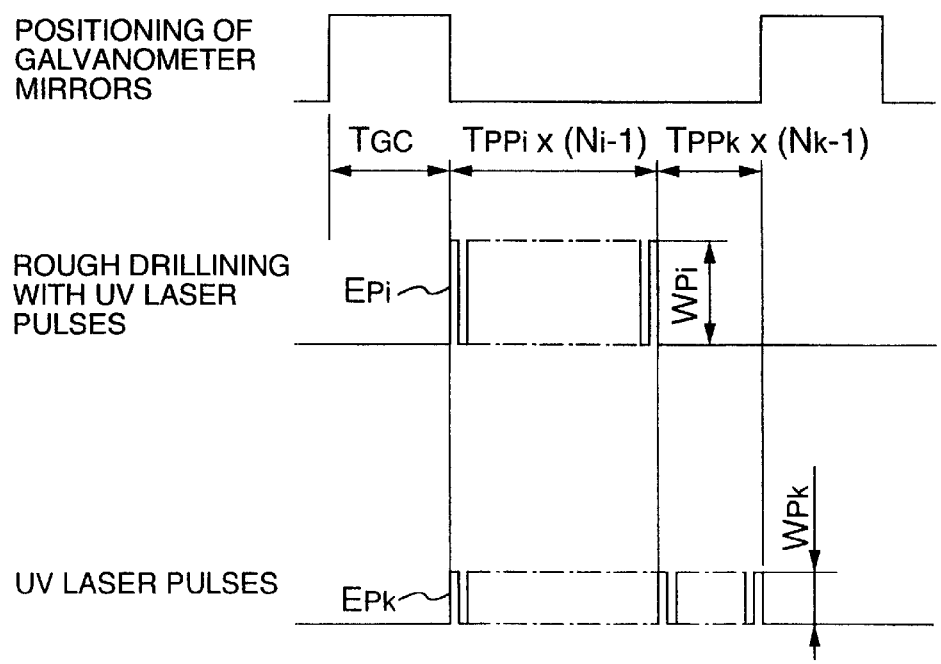

FIG. 14a is an illustration showing energy distributions of UV laser beams and thereby an extending process of a hole in a resin-direct substrate (resin thickness of 40 µm) with Apparatus Embodiment 3. FIG. 14b is a timing chart of motions of galvanometer mirrors and UV laser pulses for the process in FIG. 14a.

Almost all of the resin layer was removed with the combined laser beam of the laser beam $2_i$ of $A_i$ distribution and a sufficient energy density for removing the resin layer, and the laser beam $2_k$ of $B_k$ distribution and an energy density sufficient for removing the resin layer but less than for damaging the conductive layer. The residual thickness of 10 µm of the resin layer was left on the hole bottom, and then the residual thickness was removed with the single laser beam $2_k$ successively. The resin layer was removed, and not affected by the variation in thickness of the resin layers by selecting the residual thickness. As a result, blind via holes were formed without any damage on the hole bottom and the hole quality was improved. Furthermore, the total pulse period after positioning the galvanometer mirrors became 0.001 seconds (40 kHz and 40 shots) due to the simultaneous machining with the combined laser beam. The total pulse period with the single laser beam $2_k$ was 0.002 seconds (40 kHz and 80 shots).

(Apparatus Embodiment 4)

Figure 15:
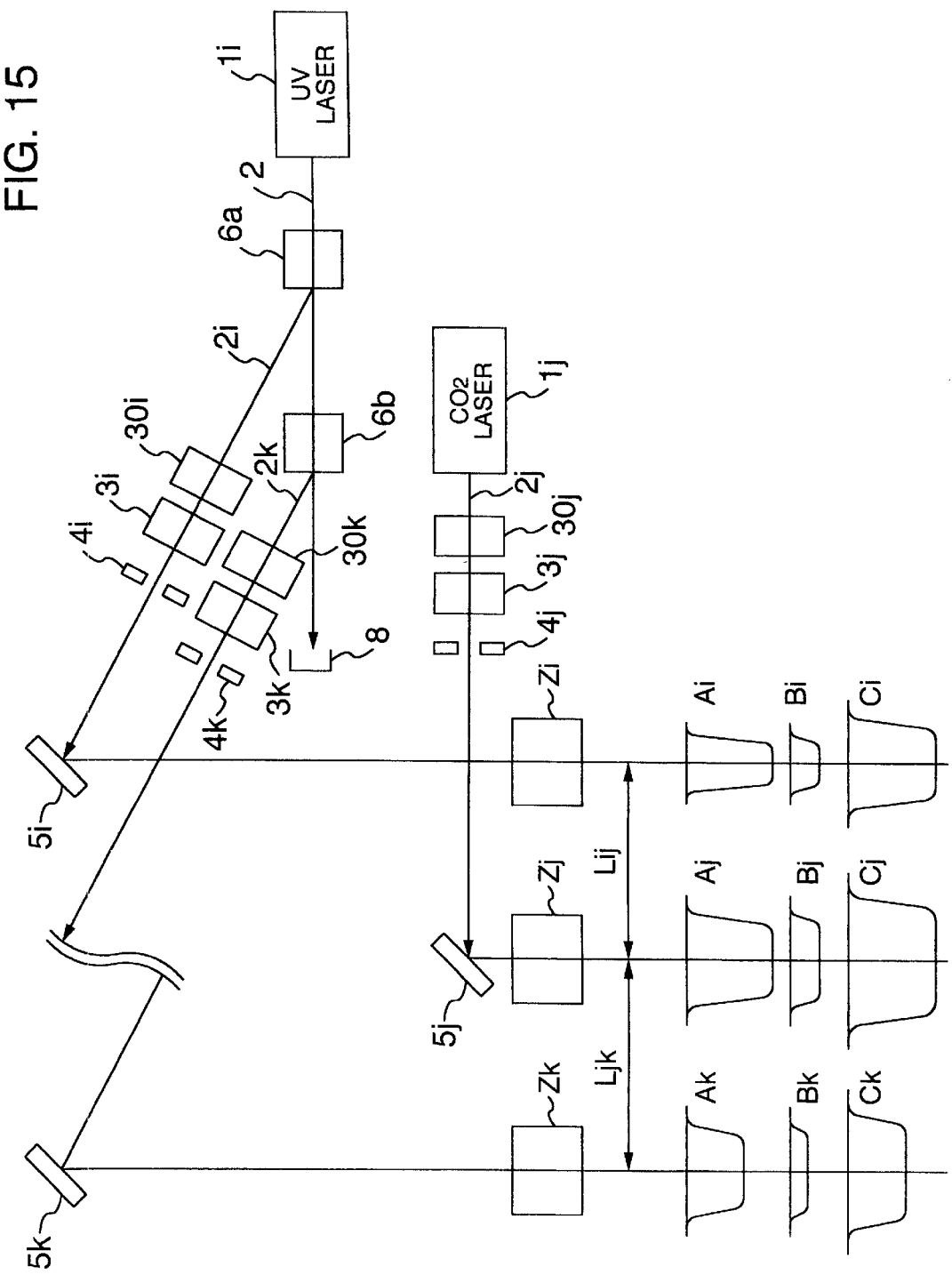
FIG. 15 is a schematic diagram of another laser machining system of the present invention.

FIG. 15 is a schematic diagram of another laser machining system as the forth apparatus embodiment of the present invention, wherein the same elements as those shown in FIGS. 4 and 12 are denoted with the same numerals.

The laser heads $1_i$ is placed in a manner that the electric vector of the laser beam 2 directs parallel to the drawing sheet, thus the polarization of the laser beams 2 become P-polarization. The numerals 6a and 6b denote acousto-optical deflectors arranged along the optical path of the laser beam 2. The numeral 8 denotes a beam dumper for dumping the 0-th order diffracted light (the transmitted light).

The energy densities of the laser beams 2, and $2_k$ decrease by about 15% compared with the laser beams $2_i$ and $2_k$ in FIG. 4 of Apparatus Embodiment 2, because of the energy loss in the acousto-optical deflectors $6_a$ and $6_b$. However, since the characteristic properties, such as spatial energy distribution, does not change, the substantially same machining ability as in FIG. 4 of Apparatus Embodiment 2 can be obtained by adjusting the output of the laser head.

(Machining Embodiment 10)

In machining a glass-containing substrate with Apparatus Embodiment 4, the following steps were employed. First, the outer conductive layer was removed with the laser beam $2_i$ of $C_i$ distribution and a sufficient energy density for removing the conductive layer, then the resin layer was removed with the laser beam $2_j$ of $A_j$ distribution, thereafter the residual smear layer on the hole bottom was removed with the laser beam $2_k$ of $B_k$ distribution to form a blind via hole. In this embodiment, the longest total pulse period after positioning the galvanometer mirrors was 0.0012 seconds during the conductive layer removal. The total pulse period for removing the resin layer was 0.003 seconds, and the total pulse period for removing the smear layer was 0.0004 seconds. Therefore, the removal of the smear layer was performed during the movement of the galvanometer mirrors for the conductive layer removal, so that the substantial machining time did not increase compared with Apparatus Embodiment 2 in FIG. 4. As a result, only one laser head $1_j$ works as the laser heads $1_i$ and $1_k$ in FIG. 4, so that the apparatus cost can be reduced.

(Apparatus Embodiment 5)

Figure 16:
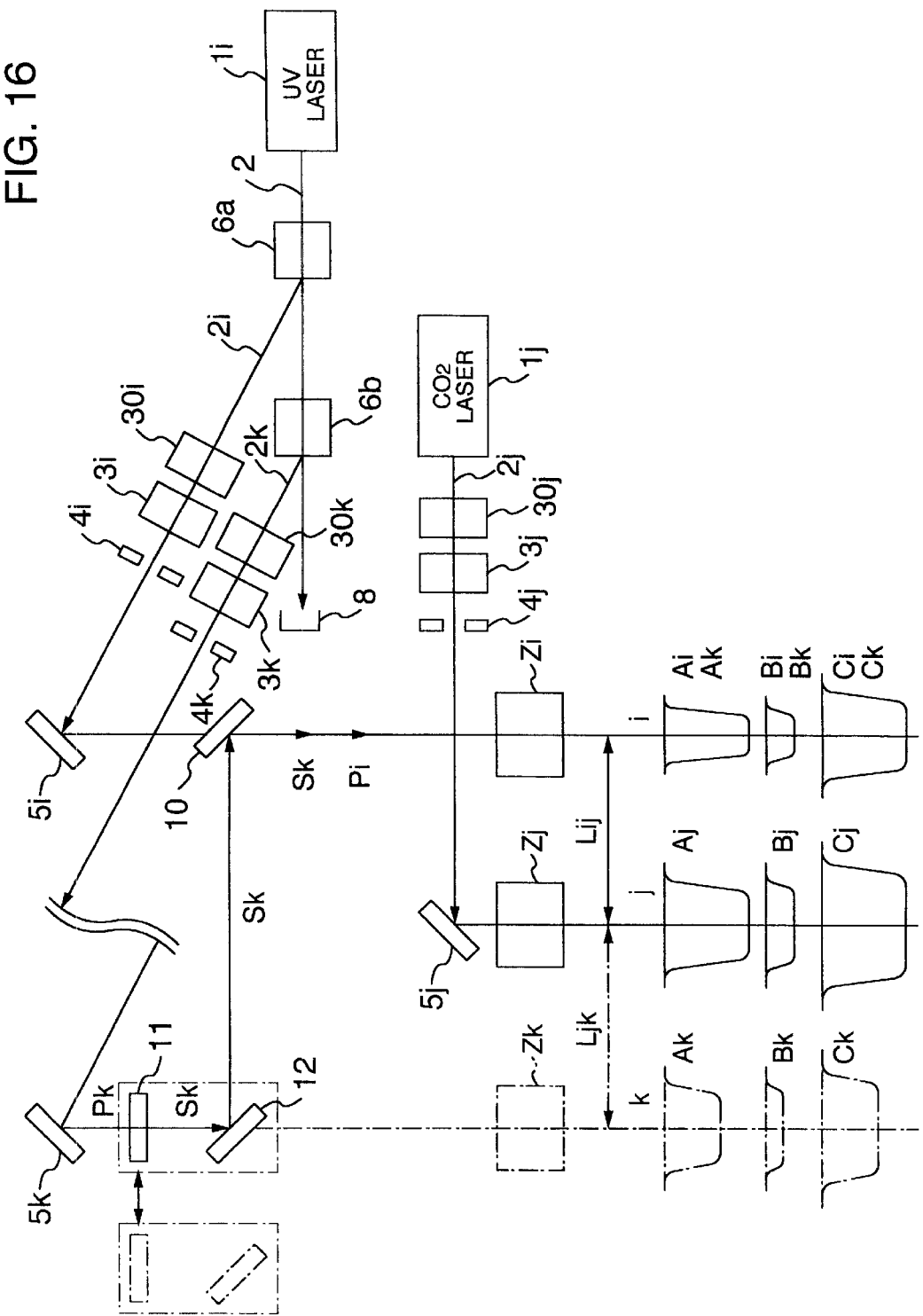
FIG. 16 is a schematic diagram of another laser machining system of the present invention.

FIG. 16 is a schematic diagram of another laser machining system as the forth apparatus embodiment of the present invention, wherein the same elements as those shown in FIGS. 4, 12 and 15 are denoted with the same numerals.

In addition to Apparatus Embodiment 4, a half-wave plate 11, a corner mirror 12, and a polarizing beam combiner 10 are arranged to guide the laser beams $2_i$ and $2_k$ coaxially to the machining area.

By removing the half-wave plate 11 and the corner mirror 12 from the optical path of the laser beam $2k$, the laser beams $2i$ and $2k$ (dotted line) ate individually used to perform machining as Apparatus Embodiment 4.

(Machining Embodiment 11)

Machining a resin-direct substrate (the thickness of the resin layer was 40 $\mu$m) with Apparatus Embodiment 5 was performed in the same way as in the Apparatus Embodiment 3. As a result, the hole quality was improved as Apparatus Embodiment 3. Furthermore, although the laser beams $2_i$ and $2_k$ were shot in respective periods after positioning the galvanometer mirrors, the total pulse period was kept 0.001 seconds (40 kHz and 40 shots) by increasing the output of the laser head.

The function of the laser beam machining apparatus can be equal to that of Apparatus Embodiment 3 by removing the half-wave plate 11 and the corner mirror 12 from the optical path. Thus, the functions of the Apparatus Embodiment 3 can be achieved with a single laser head. As a result, the apparatus cost can be reduced.

What is claimed is:

1. A method for forming an blind via hole to expose an inner conductive layer in a printed wiring board laminated with a layer or layers of conductor and a layer or layers of resin alternately, comprising:

applying a first UV laser beam and/or an infrared laser beam to drill the via hole until the residual layer of the resin layer contacting said inner conductive layer is reached, and applying a second UV laser beam having an energy density higher than the decomposition energy threshold of said resin layer and lower than the decomposition energy threshold of said inner conductive layer, to remove said residual layer.

2. The method of claim 1, wherein the first UV laser beam which has a top-hat-shaped spatial energy distribution and a energy density higher than the decomposition energy thresholds of the conductive and the resin layers is employed for machining until the residual layer of the resin layer contacting said inner conductive layer is reached.

3. The method of claim 2, wherein the first surface layer of said printed wiring board is a resin layer and the second UV laser beam has a top-hat-shaped spatial energy distribution and the same beam diameter as that of the hole made by the first laser beam.

4. A apparatus for laser machining a printed wiring board, comprising:

a laser head, a optical deflector for switching the optical paths for the laser beam emitted from said laser head, optical elements arranged along said optical paths to adjust the energy densities, spatial energy distributions and beam diameters of the laser beams individually, and a common optical path for the laser beams traveling after adjusting the energy densities, spatial energy distributions and beam diameters.

5. A method for using the apparatus of claim 4, comprising:

making a first UV laser beam by deflecting a laser beam emitted from the UV laser head with the optical deflector, adjusting the first UV laser beam to have a high energy density by condensing with the optical elements, making a second UV laser beam by transmitting a laser beam emitted from the UV laser head through the optical deflector, adjusting the second UV laser beam to have a low energy density by expanding with the optical elements, and traveling the common optical path for the laser beams after adjusting the energy densities, spatial energy distributions and beam diameters.

6. The method of claim 1, wherein a layer or layers of conductor are removed with the first UV laser beam having an energy density higher than the decomposition energy density of the conductor, a layer or layers of resin are removed with the infrared laser beam, and said procedures are repeated until the residual layer of the resin layer contacting said inner conductive layer is reached.

7. The method of claim 6, wherein the first and the/second UV laser beams are obtained from a UV laser head, and the energy densities, spatial energy distributions, beam diameters of the laser beams are adjusted individually suitable for removing a conductive layer and the residual layer, respectively.

8. A apparatus for laser machining a printed wiring board, comprising:

a laser head, a first and a second laser beams are obtained by switching optical paths for the laser beam emitted from said laser head, another laser head, optical elements arranged along the optical paths to adjust the energy densities, spatial energy distributions and beam diameters individually.

9. The apparatus of claim 8, wherein a optical deflector for switching the first and the second laser beams.

10. The apparatus of claim 8, wherein a common optical path for the first and the second laser beams traveling after adjusting the energy densities, spatial energy distributions and beam diameters.

* * * * *